United States Patent
Xu et al.

(10) Patent No.: US 12,040,402 B2
(45) Date of Patent: Jul. 16, 2024

(54) SEMICONDUCTOR DEVICE

(71) Applicant: Samsung Electronics Co., Ltd., Suwon-si (KR)

(72) Inventors: Yang Xu, Suwon-si (KR); Nam Kyu Cho, Yongin-si (KR); Seok Hoon Kim, Suwon-si (KR); Yong Seung Kim, Seongnam-si (KR); Pan Kwi Park, Incheon (KR); Dong Suk Shin, Suwon-si (KR); Sang Gil Lee, Ansan-si (KR); Si Hyung Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 290 days.

(21) Appl. No.: 17/690,178

(22) Filed: Mar. 9, 2022

(65) Prior Publication Data

US 2023/0058991 A1 Feb. 23, 2023

(30) Foreign Application Priority Data

Aug. 23, 2021 (KR) ........................ 10-2021-0110811

(51) Int. Cl.
*H01L 29/76* (2006.01)
*H01L 27/088* (2006.01)
(Continued)

(52) U.S. Cl.
CPC ...... *H01L 29/7851* (2013.01); *H01L 27/0886* (2013.01); *H01L 29/0649* (2013.01); *H01L 29/41791* (2013.01)

(58) Field of Classification Search
CPC ............ H01L 29/7851; H01L 27/0886; H01L 29/0649; H01L 29/41791; H01L 29/785; H01L 29/66795
(Continued)

(56) References Cited

U.S. PATENT DOCUMENTS 9,312,274 B1 4/2016 Bryant et al.
9,780,169 B2 10/2017 Hsu et al.
(Continued)

FOREIGN PATENT DOCUMENTS

KR 10-2019-0023882 A 3/2019

OTHER PUBLICATIONS

European Office Action dated Dec. 6, 2022 issued in European Patent Application No. 22 173 519.4-1020.
(Continued)

*Primary Examiner* — Theresa T Doan
(74) *Attorney, Agent, or Firm* — Harness, Dickey & Pierce, P.L.C.

(57) ABSTRACT

A semiconductor device including first fin-shaped patterns in a first region of a substrate and spaced apart from each other in a first direction, second fin-shaped patterns in a second region of the substrate and spaced apart from each other in a second direction, a first field insulating film on the substrate and covering sidewalls of the first fin-shaped patterns, a second field insulating film on the substrate and covering sidewalls of the second fin-shaped patterns, a first source/drain pattern on the first field insulating film, connected to the first fin-shaped patterns, and including a first silicon-germanium pattern, and a second source/drain pattern on the second field insulating film, connected to the second fin-shaped patterns, and including a second silicon-germanium pattern, the second source/drain pattern and the second field insulating film defining one or more first air gaps therebetween may be provided.

12 Claims, 25 Drawing Sheets

(51) Int. Cl.
  *H01L 29/06* (2006.01)
  *H01L 29/417* (2006.01)
  *H01L 29/78* (2006.01)
  *H01L 29/94* (2006.01)
(58) Field of Classification Search
  USPC .......................................................... 257/288
  See application file for complete search history.

(56) References Cited

U.S. PATENT DOCUMENTS

| | | |
|---|---|---|
| 9,865,504 B2 | 1/2018 | Lee et al. |
| 9,882,054 B2 | 1/2018 | Liou et al. |
| 9,985,114 B2 | 5/2018 | Basker et al. |
| 10,103,249 B2 | 10/2018 | Lee et al. |
| 10,854,602 B2 | 12/2020 | Li et al. |
| 10,896,964 B2 | 1/2021 | Yu et al. |
| 2014/0183605 A1* | 7/2014 | Mochizuki ........ H01L 29/66795 257/288 |
| 2015/0228761 A1* | 8/2015 | Cheng ............... H01L 29/66795 257/365 |
| 2016/0293697 A1 | 10/2016 | Kim et al. |
| 2016/0351570 A1 | 12/2016 | Park et al. |
| 2019/0348414 A1 | 11/2019 | Hong et al. |

OTHER PUBLICATIONS

European Search Report dated Nov. 22, 2022 issued in European Patent Application No. 22173519.4-1020.

\* cited by examiner

SEMICONDUCTOR DEVICE

CROSS-REFERENCE TO RELATED APPLICATION

This application claims priority from Korean Patent Application No. 10-2021-0110811 filed on Aug. 23, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to semiconductor devices.

2. Description of the Related Art

As one of scaling technologies for increasing a density of a semiconductor device, a multi-gate transistor in which a multi-channel active pattern (or a silicon body) having a fin or nanowire shape is formed on a substrate and gates are formed on a surface of the multi-channel active pattern has been proposed.

Such a multi-gate transistor uses a three-dimensional channel, and it is thus easy to perform scaling. In addition, a current control capability may be improved without increasing a gate length of the multi-gate transistor. Furthermore, a short channel effect (SCE) that a potential of a channel region is affected by a drain voltage may be effectively suppressed.

Meanwhile, as a pitch size of the semiconductor device decreases, research has been required to decrease a capacitance and secure electrical stability between contacts in the semiconductor device.

SUMMARY

Aspects of the present disclosure provide semiconductor devices capable of improving performance and reliability of an element.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a semiconductor device includes a plurality of first fin-shaped patterns in a first region of a substrate and spaced apart from each other in a first direction, a plurality of second fin-shaped patterns in a second region of the substrate and spaced apart from each other in a second direction, a first field insulating film on the substrate and covering sidewalls of the first fin-shaped patterns, a second field insulating film on the substrate and covering sidewalls of the second fin-shaped patterns, a first source/drain pattern on the first field insulating film, connected to the first fin-shaped patterns, and including a first silicon-germanium pattern, and a second source/drain pattern on the second field insulating film, connected to the second fin-shaped patterns, and including a second silicon-germanium pattern, the second source/drain pattern and the second field insulating film defining one or more first air gaps therebetween, wherein the first source/drain pattern includes first bottom surfaces connected to respective ones of the first fin-shaped patterns and one or more first connection surfaces each connecting a corresponding adjacent pair of the first bottom surfaces with each other, the second source/drain pattern includes second bottom surfaces connected to respective ones of the second fin-shaped patterns and one or more second connection surfaces each connecting a corresponding adjacent pair of the second bottom surfaces to each other, a number of first air gaps is same as a number of second connection surfaces, and at least one of the first connection surfaces is in entire contact with an upper surface of the first field insulating film.

According to another aspect of the present disclosure, a semiconductor device includes a plurality of first fin-shaped patterns in a first region of a substrate and spaced apart from each other, a first field insulating film on the substrate and covering sidewalls of the first fin-shaped patterns, and a first source/drain pattern on the first field insulating film and connected to the first fin-shaped patterns, wherein the first source/drain pattern includes a plurality of first epitaxial regions, connection semiconductor regions, and a second epitaxial region, the first epitaxial regions on respective ones of the first fin-shaped patterns, the connection semiconductor regions extending along an upper surface of the first field insulating film and in contact with the first field insulating film, and the second epitaxial region being on the first epitaxial regions and the connection semiconductor regions, the second epitaxial region connecting the first epitaxial regions and the connection semiconductor regions to each other, the first epitaxial region, the connection semiconductor region, and the second epitaxial region include silicon-germanium, and a fraction of germanium in the connection semiconductor region is smaller than a fraction of germanium in the second epitaxial region.

According to still another aspect of the present disclosure, a semiconductor device includes a plurality of first fin-shaped patterns in an I/O region of a substrate and the first fin-shaped patterns spaced apart from each other in a first direction, a plurality of second fin-shaped patterns in a logic region of the substrate and second fin-shaped patterns the spaced apart from each other in a second direction, a first field insulating film on the substrate and covering sidewalls of the first fin-shaped patterns, a second field insulating film on the substrate and covering sidewalls of the second fin-shaped patterns, a first source/drain pattern on the first field insulating film, connected to the first fin-shaped patterns, and including a first silicon-germanium pattern on the first fin-shaped patterns, a second source/drain pattern on the second field insulating film, connected to the second fin-shaped patterns, and including a second silicon-germanium pattern, and one or more air gaps between the second source/drain pattern and the second field insulating film, wherein the first source/drain pattern includes bottom surfaces connected to respective ones of the first fin-shaped patterns and one or more connection surfaces each connecting a corresponding adjacent pair of the bottom surfaces to each other, a number of first fin-shaped patterns is more than a number of second fin-shaped patterns, a number of air gaps is one less than the number of second fin-shaped patterns, and the one or more connection surfaces are in entire contact with upper surface of the first field insulating film.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
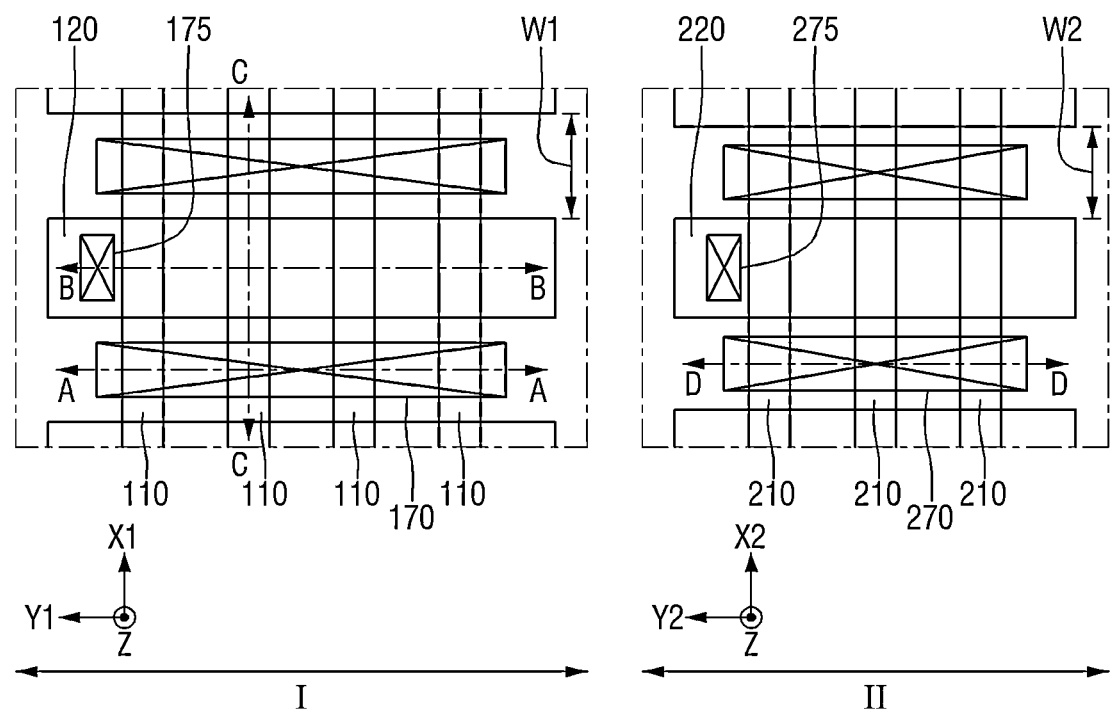
FIG. 1 is an illustrative layout diagram for describing a semiconductor device according to some example embodiments.

In the drawings of semiconductor devices according to some example embodiments, a fin field effect transistor (FinFET) including a channel region having a fin-shaped pattern shape, a transistor including a nanowire or a nanosheet, and a multi-bridge channel field effect transistor (MBCFET™) have been illustrated by way of example, but the present disclosure is not limited thereto. Semiconductor devices according to some example embodiments may include a tunneling field effect transistor (FET) or a three-dimensional (3D) transistor. Semiconductor device according to some example embodiments may include a planar transistor. Further, the technical spirit or concepts of the present disclosure may be applied to two-dimensional (2D) material based FETs and heterostructures thereof.

Further, the semiconductor device according to some example embodiments may include a bipolar junction transistor, a lateral double-diffused metal oxide semiconductor (LDMOS) transistor, or the like.

A semiconductor device according to some example embodiments will be described with reference to FIGS. 1 to 7.

Figure 2:
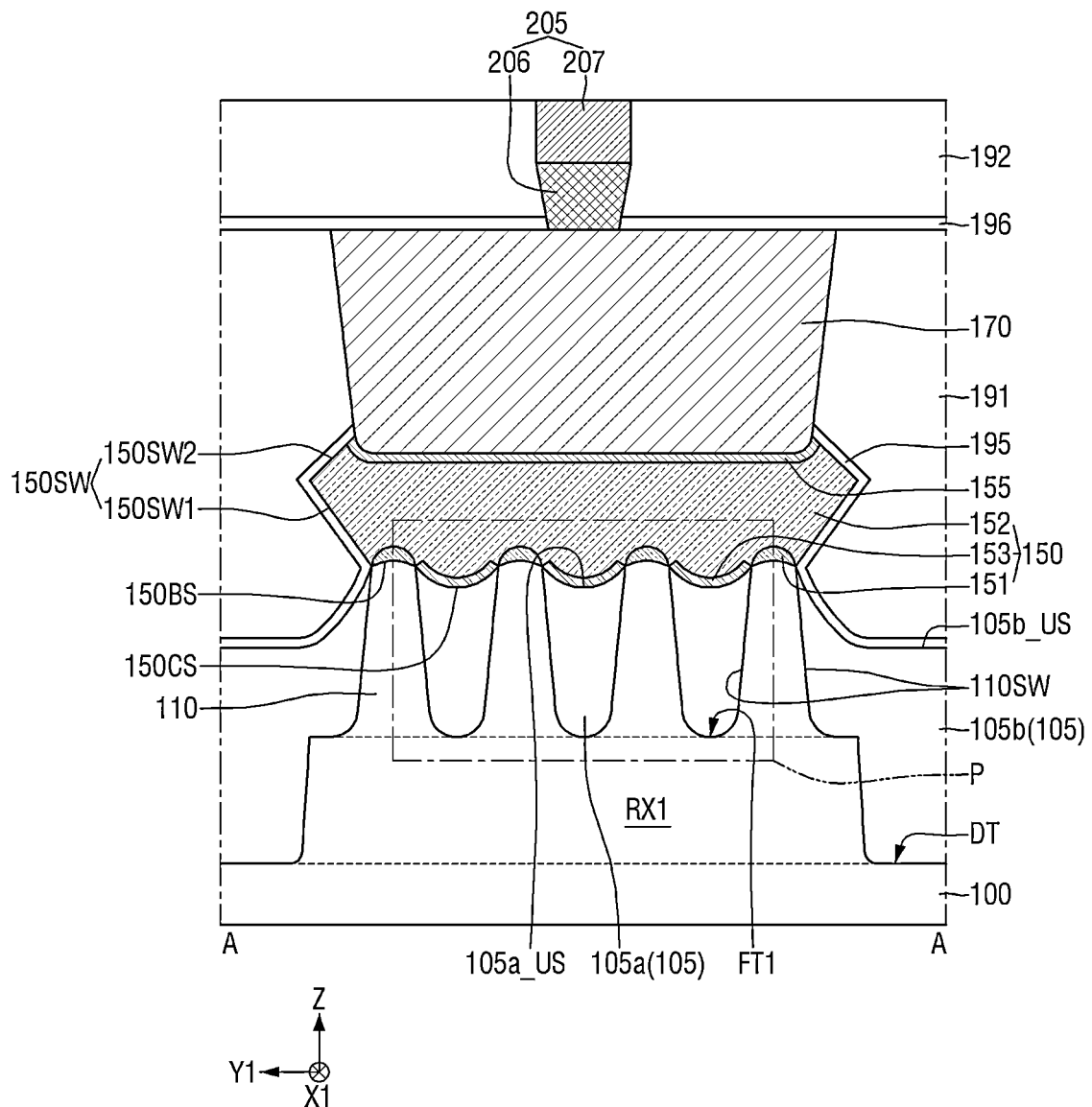
FIG. 2 is a cross-sectional view taken along line A-A of FIG. 1.
Figure 3:
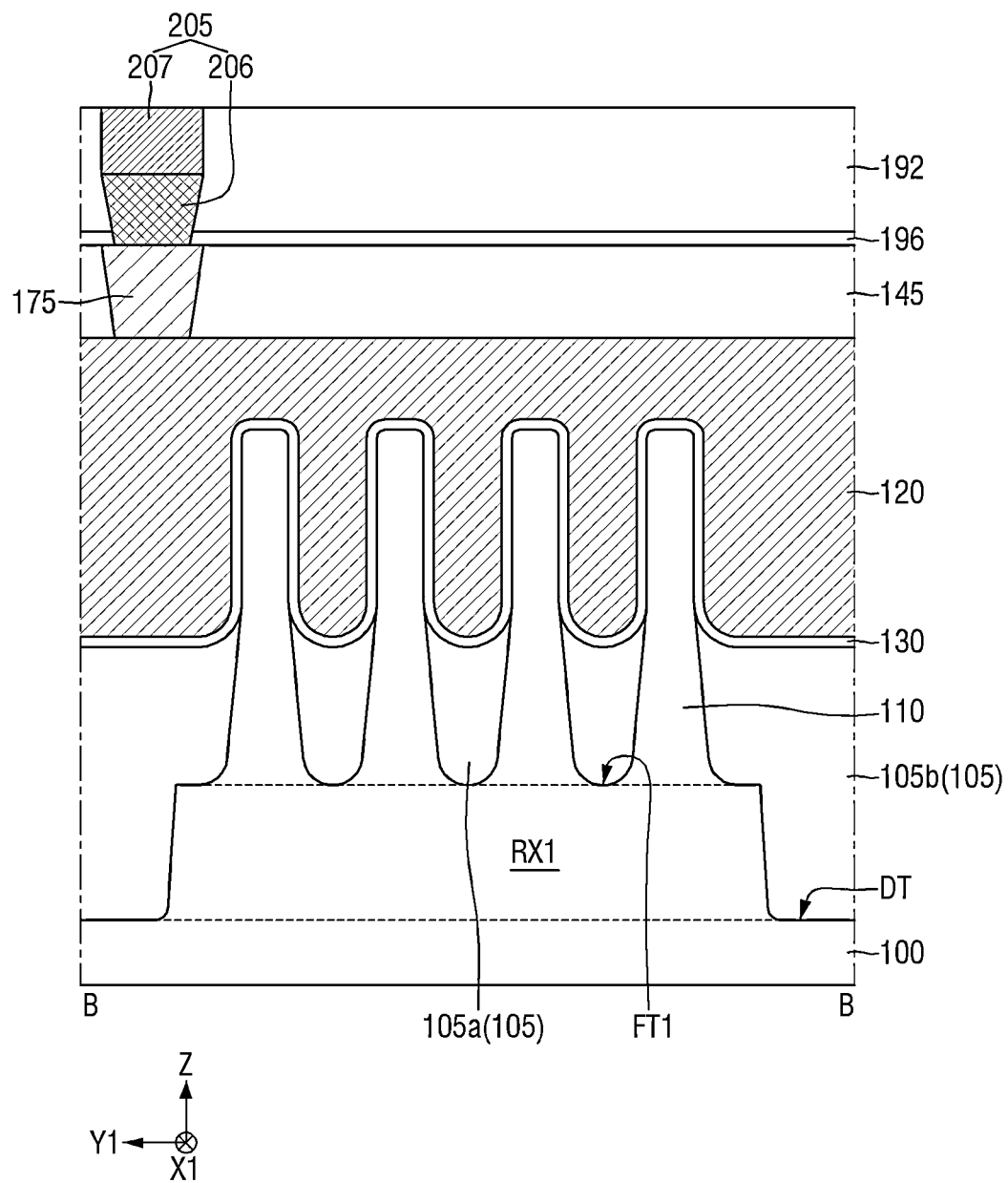
FIG. 3 is a cross-sectional view taken along line B-B of FIG. 1.
Figure 4:
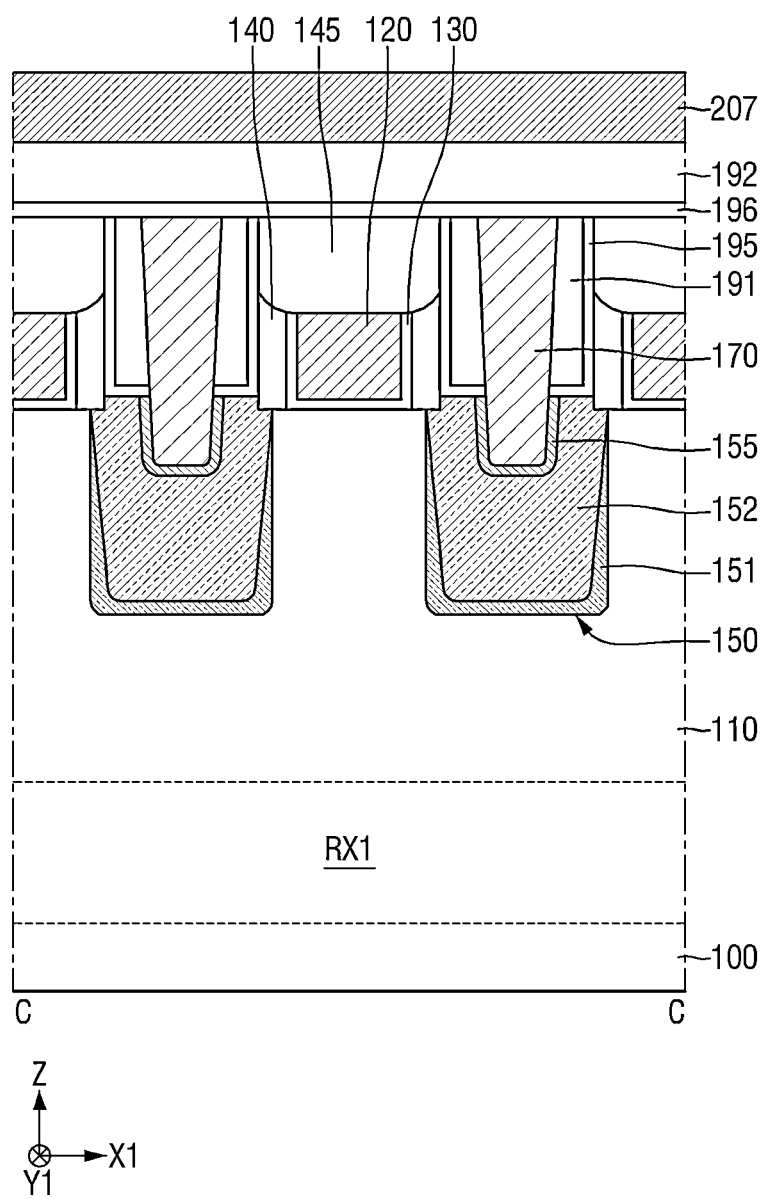
FIG. 4 is a cross-sectional view taken along line C-C of FIG. 1.
Figure 5:
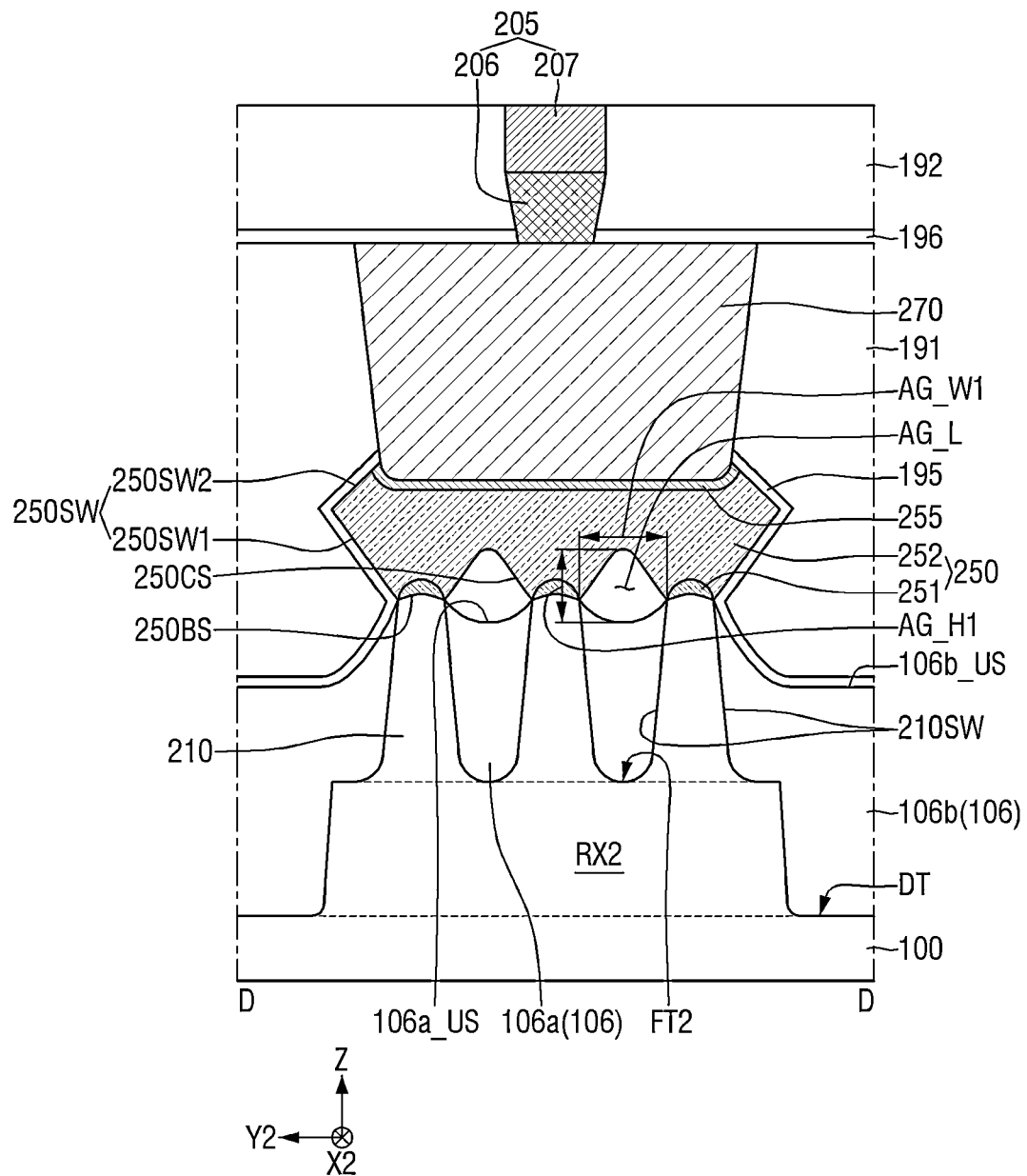
FIG. 5 is a cross-sectional view taken along line D-D of FIG. 1.
Figure 6:
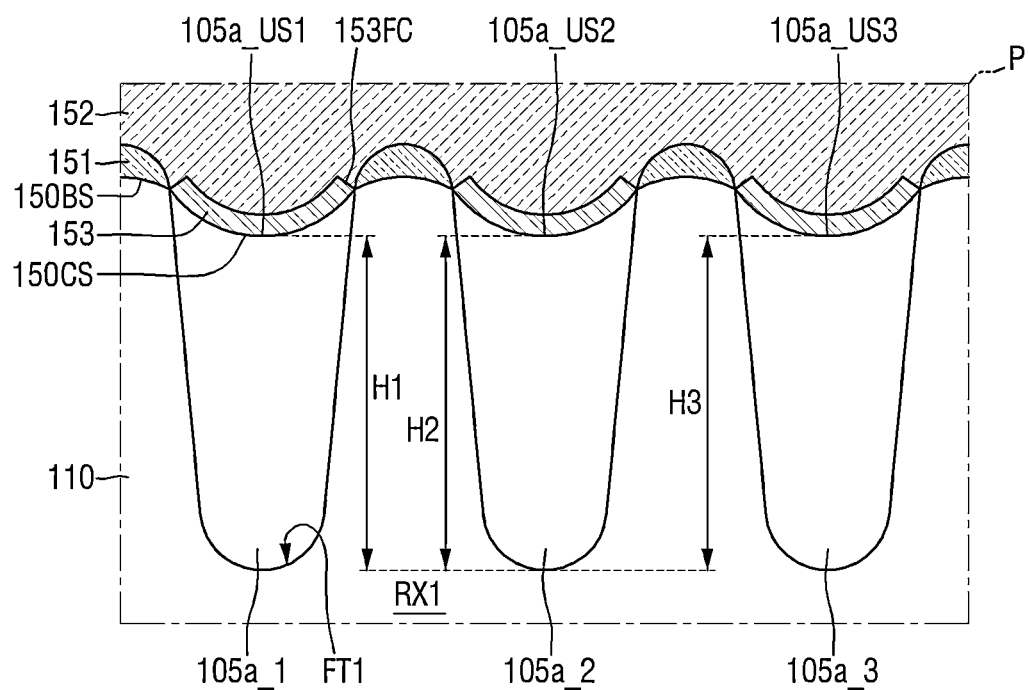
FIGS. 6 and 7 are enlarged views of part P of FIG. 2.
Figure 7:
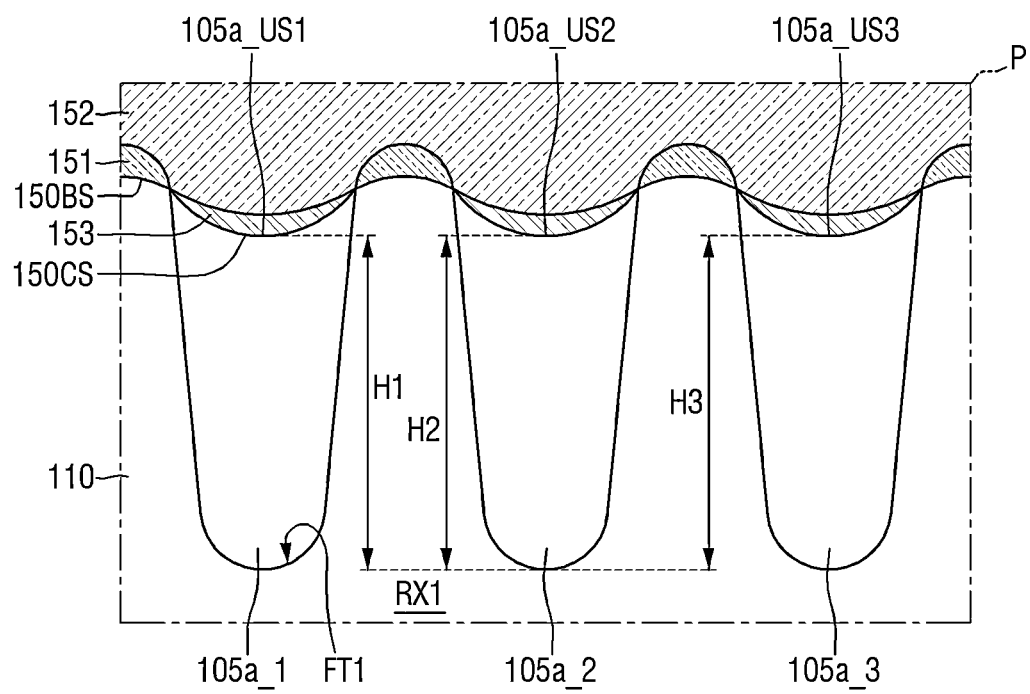

FIG. 1 is an illustrative layout diagram for describing a semiconductor device according to some example embodiments. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1. FIG. 5 is a cross-sectional view taken along line D-D of FIG. 1. FIGS. 6 and 7 are enlarged views of part P of FIG. 2. For convenience of explanation, a via plug 206 and a wiring line 207 are not illustrated in FIG. 1.

For reference, it has been illustrated in the drawings that a first gate contact 175 and a second gate contact 275 are disposed at one end of a first gate electrode 120 and one end of a second gate electrode 220, respectively, but this is only for convenience of explanation, and the present disclosure is not limited thereto.

Referring to FIGS. 1 to 7, the semiconductor device according to some example embodiments may include a plurality of first fin-shaped patterns 110, a plurality of second fin-shaped patterns 210, first gate electrodes 120, second gate electrodes 220, first source/drain patterns 150, and second source/drain patterns 250.

A substrate 100 may include a first region I and a second region II. The first region I and the second region II may perform different functions. For example, the first region I of the substrate 100 may be an I/O region associated with input/output of the semiconductor device, and the second region II of the substrate 100 may be a logic region.

Transistors of the same conductivity type may be formed in the first region I of the substrate 100 and the second region II of the substrate 100. For example, each of the first region I of the substrate 100 and the second region II of the substrate 100 may be a P-channel metal oxide semiconductor (PMOS) formation region.

The substrate 100 may be bulk silicon or silicon-on-insulator (SOI). In some example embodiments, the substrate 100 may be a silicon substrate or may include other materials such as silicon germanium, silicon germanium on insulator (SGOI), indium antimonide, lead tellurium compound, indium arsenide, indium phosphide, gallium arsenide, or gallium antimonide, but the present disclosure is not limited thereto.

The plurality of first fin-shaped patterns 110 may be disposed in the first region I of the substrate 100. The first fin-shaped patterns 110 may be disposed in a first active region RX1. The first fin-shaped patterns 110 may protrude from the substrate 100, more specifically, the first active region RX1.

The first fin-shaped patterns 110 may extend to be elongated along the first direction X1. The first fin-shaped patterns 110 may be spaced apart from each other in a second direction Y1 crossing the first direction X1. That is, the plurality of first fin-shaped patterns 110 may be spaced apart from each other in the second direction Y1 and be arranged in the second direction Y1.

The first fin-shaped patterns 110 may be defined by first fin trenches FT1 extending in the first direction X1. The first fin trenches FT1 may define sidewalls 110SW of the first fin-shaped patterns.

The plurality of second fin-shaped patterns 210 may be disposed in the second region II of the substrate 100. The second fin-shaped patterns 210 may be disposed in a second active region RX2. The second fin-shaped patterns 210 may protrude from the substrate 100, more specifically, the second active region RX2.

The second fin-shaped patterns 210 may extend to be elongated along the third direction X2. The second fin-shaped patterns 210 may be spaced apart from each other in a fourth direction Y2 crossing the third direction X2. That is, the plurality of second fin-shaped patterns 210 may be spaced apart from each other in the fourth direction Y2 and be arranged in the fourth direction Y2.

The second fin-shaped patterns 210 may be defined by second fin trenches FT2 extending in the third direction X2.

The second fin trenches FT2 may define sidewalls 210SW of the second fin-shaped patterns.

The first direction X1 and the second direction Y1 may cross a fifth direction Z. The third direction X2 and the fourth direction Y2 may cross the fifth direction Z. The fifth direction Z may be a direction perpendicular to an upper surface of the substrate 100.

The first active region RX1 and the second active region RX2 may be defined by deep trenches DT. The deep trench DT is deeper than the first fin trench FT1 and the second fin trench FT2. For example, the deep trench DT may extend to be elongated in the first direction X1 or the third direction X2.

The number of first fin-shaped patterns 110 disposed in the first active region RX1 is more than the number of second fin-shaped patterns 210 disposed in the second active region RX2. For example, the number of first fin-shaped patterns 110 may be four or more. The number of second fin-shaped patterns 210 may be three or less.

The first fin-shaped patterns 110 and the second fin-shaped patterns 210 may be portions of the substrate 100, respectively, and may include epitaxial layers grown from the substrate 100. Each of the first fin-shaped patterns 110 and the second fin-shaped patterns 210 may include, for example, silicon or germanium, which is an element semiconductor material. Further, each of the first fin-shaped patterns 110 and the second fin-shaped patterns 210 may include a compound semiconductor, for example, a group IV-IV compound semiconductor or a group III-V compound semiconductor.

The group IV-IV compound semiconductor may be, for example, a binary compound or a ternary compound including two or more of carbon (C), silicon (Si), germanium (Ge), and tin (Sn), or a compound obtained by doping carbon (C), silicon (Si), germanium (Ge), and tin (Sn) with a group IV element.

The group III-V compound semiconductor may be, for example, one of a binary compound, a ternary compound, or a quaternary compound formed by combining at least one of aluminum (Al), gallium (Ga), and indium (In), which are group III elements, with one of phosphorus (P), arsenic (As), and antimony (Sb), which are group V elements.

As an example, the first fin-shaped pattern 110 and the second fin-shaped pattern 210 may be silicon fin-shaped patterns. As another example, the first fin-shaped pattern 110 and the second fin-shaped pattern 210 may be fin-shaped patterns including silicon-germanium patterns.

A first field insulating film 105 and a second field insulating film 106 may be formed on the substrate 100. The first field insulating film 105 may be disposed in the first region I of the substrate 100. The second field insulating film 106 may be disposed in the second region II of the substrate 100.

The first field insulating film 105 may fill the deep trench DT. The first field insulating film 105 may fill portions of the first fin trenches FT1. The first field insulating film 105 may cover at least portions of the sidewalls 110SW of the plurality of first fin-shaped patterns.

The first field insulating film 105 may include a first inner field insulating film 105a and a first outer field insulating film 105b. The first inner field insulating film 105a may be disposed between a couple of the first fin-shaped patterns 110 that are adjacent to each other in the second direction Y1. The first outer field insulating film 105b may be disposed around the first active region RX1. In the first fin-shaped pattern 110 disposed at the outermost portion of the first active region RX1, a first sidewall 110SW of the first fin-shaped pattern may be covered by the first inner field insulating film 105a, and a second sidewall 110SW of the first fin-shaped pattern may be covered by the first outer field insulating film 105b. The first sidewall 110SW of the first fin-shaped pattern and the second sidewall 110SW of the first fin-shaped pattern are sidewalls opposing each other in the second direction Y1.

A portion of the first fin-shaped pattern 110 may protrude above an upper surface 105a_US of the first inner field insulating film and an upper surface 105b_US of the first outer field insulating film. On the basis of a bottom surface of the deep trench DT, the lowermost portion of the upper surface 105a_US of the first inner field insulating film is higher than the lowermost portion of the upper surface 105b_US of the first outer field insulating film.

The second field insulating film 106 may fill the deep trench DT. The second field insulating film 106 may fill portions of the second fin trenches FT2. The second field insulating film 106 may cover the sidewalls 210SW of the plurality of second fin-shaped patterns.

The second field insulating film 106 may include a second inner field insulating film 106a and a second outer field insulating film 106b. The second inner field insulating film 106a may be disposed between a pair of the second fin-shaped patterns 210 that are adjacent to each other in the fourth direction Y2. The second outer field insulating film 106b may be disposed around the second active region RX2. In the second fin-shaped pattern 210 disposed at the outermost portion of the second active region RX2, a first sidewall 210SW of the second fin-shaped pattern may be covered by the second inner field insulating film 106a, and a second sidewall 210SW of the second fin-shaped pattern may be covered by the second outer field insulating film 106b. The first sidewall 210SW of the second fin-shaped pattern and the second sidewall 210SW of the second fin-shaped pattern are sidewalls opposing each other in the fourth direction Y2.

A portion of the second fin-shaped pattern 210 may protrude above an upper surface 106a_US of the second inner field insulating film and an upper surface 106b_US of the second outer field insulating film. On the basis of a bottom surface of the deep trench DT, the lowermost portion of the upper surface 106a_US of the second inner field insulating film is higher than the lowermost portion of the upper surface 106b_US of the second outer field insulating film.

Each of the first field insulating film 105 and the second field insulating film 106 may include an insulating material. For example, each of the first field insulating film 105 and the second field insulating film 106 may include an oxide film, a nitride film, an oxynitride film, or combination films thereof, but the present disclosure is not limited thereto. It has been illustrated in the drawings that each of the first field insulating film 105 and the second field insulating film 106 is a single layer, but this is only for convenience of explanation, and the present disclosure is not limited thereto.

The first gate electrodes 120 may be disposed in the first region I of the substrate 100. The first gate electrodes 120 may be disposed on the first field insulating film 105. The first gate electrodes 120 may extend in the second direction Y1.

The first gate electrodes 120 may be disposed on the first fin-shaped patterns 110. The first gate electrodes 120 may cross the plurality of first fin-shaped patterns 110. Adjacent first gate electrodes 120 may be spaced apart from each other in the first direction X1.

The second gate electrodes 220 may be disposed in the second region II of the substrate 100. The second gate electrodes 220 may be disposed on the second field insulating film 106. The second gate electrodes 220 may extend in the fourth direction Y2.

The second gate electrodes 220 may be disposed on the second fin-shaped patterns 210. The second gate electrodes 220 may cross the plurality of second fin-shaped patterns 210. Adjacent second gate electrodes 220 may be spaced apart from each other in the third direction X2.

For example, a distance W1 between the first gate electrodes 120 adjacent to each other in the first direction X1 may be greater than the distance W2 between the second gate electrodes 220 adjacent to each other in the third direction X2.

It has been illustrated in the drawings that the first gate electrode 120 crosses only the first fin-shaped patterns 110 disposed in the first active region RX1, but the present disclosure is not limited thereto. The first gate electrode 120 may extend in the second direction Y1 to cross fin-shaped patterns in another active region adjacent to the first active region RX1 in the second direction Y1. Similarly, it has been illustrated in the drawings that the second gate electrode 220 crosses only the second fin-shaped patterns 210 disposed in the second active region RX2, but the present disclosure is not limited thereto.

Although not illustrated in the drawings, a cross-sectional view of the second gate electrode 220 taken along in the fourth direction Y2 may be similar to FIG. 3. Further, a cross-sectional view of the second fin-shaped pattern 210 taken along in the third direction X2 may be similar to FIG. 4. Accordingly, a first gate electrode 120, a first gate insulating film 130, a first gate spacer 140, and a first gate capping pattern 145 disposed in the first region I of the substrate 100 will be mainly described hereinafter.

The first gate electrode 120 may surround the first fin-shaped patterns 110 protruding above the upper surfaces 105$a$_US and 105$b$_US of the first field insulating film 105.

Each of the first gate electrode 120 and the second gate electrode 220 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof.

Each of the first gate electrode 120 and the second gate electrode 220 may include conductive metal oxide, conductive metal oxynitride, or the like, and may include a form in which the above-described material is oxidized.

The first gate spacers 140 may be disposed on sidewalls of the first gate electrode 120. The first gate spacers 140 may extend in the second direction Y1. The first gate spacers 140 may include, for example, at least one of silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), or combinations thereof.

The first gate insulating film 130 may extend along sidewalls and a bottom surface of the first gate electrode 120. The first gate insulating film 130 may be formed on the first fin-shaped pattern 110 and the first field insulating film 105. The first gate insulating film 130 may be formed between the first gate electrode 120 and the first gate spacers 140.

The first gate insulating film 130 may be formed along a profile of the first fin-shaped pattern 110 protruding above the first field insulating film 105 and along the upper surfaces 105$a$_US and 105$b$_US of the first field insulating film. Although not illustrated in the drawings, an interface layer may be further formed along the profile of the first fin-shaped pattern 110 protruding above the first field insulating film 105. The first gate insulating film 130 may be formed on the interface layer.

The first gate insulating film 130 may include silicon oxide, silicon oxynitride, silicon nitride, or a high-k material having a dielectric constant greater than that of the silicon oxide. The high-k material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some example embodiments may include a negative capacitance (NC) field effect transistor (FET) using a negative capacitor. For example, the first gate insulating film 130 may include a ferroelectric material film having ferroelectric characteristics and a paraelectric material film having paraelectric characteristics.

The ferroelectric material film may have a negative capacitance, and the paraelectric material film may have a positive capacitance. For example, when two or more capacitors are connected to each other in series and capacitances of respective capacitors have a positive value, a total capacitance decreases as compared with a capacitance of each individual capacitor. On the other hand, when at least one of capacitances of two or more capacitors connected to each other in series has a negative value, a total capacitance may have a positive value and be greater than an absolute value of each individual capacitance.

When the ferroelectric material film having the negative capacitance and the paraelectric material film having the positive capacitance are connected to each other in series, a total capacitance value of the ferroelectric material film and the paraelectric material film connected to each other in series may increase. A transistor including the ferroelectric material film may have a subthreshold swing (SS) less than 60 mV/decade at room temperature using the increase in the total capacitance value.

The ferroelectric material film may have the ferroelectric characteristics. The ferroelectric material film may include, for example, at least one of hafnium oxide, hafnium zirconium oxide, barium strontium titanium oxide, barium titanium oxide, or lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A type of dopant included in the ferroelectric material film may change depending on a type of ferroelectric material included in the ferroelectric material film.

When the ferroelectric material film includes the hafnium oxide, the dopant included in the ferroelectric material film may include, for example, at least one of gadolinium (Gd), silicon (Si), zirconium (Zr), aluminum (Al), or yttrium (Y).

When the dopant is aluminum (Al), the ferroelectric material film may include 3 to 8 atomic % (at %) of aluminum. Here, a ratio of the dopant may refer to a ratio of aluminum to the sum of hafnium and the dopant (e.g., aluminum).

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric characteristics. The paraelectric material film may include, for example, at least one of silicon oxide or metal oxide that has a high dielectric constant. The metal oxide included in the paraelectric material film may include, for example, at least one of hafnium oxide, zirconium oxide, or aluminum oxide, but the present disclosure is not limited thereto.

The ferroelectric material film and the paraelectric material film may include the same material. The ferroelectric material film may have the ferroelectric characteristics, but the paraelectric material film may not have the ferroelectric characteristics. For example, when the ferroelectric material film and the paraelectric material film include hafnium oxide, a crystal structure of the hafnium oxide included in the ferroelectric material film is different from a crystal structure of the hafnium oxide included in the paraelectric material film.

The ferroelectric material film may have a thickness having the ferroelectric characteristics. The thickness of the ferroelectric material film may be, for example, 0.5 to 10 nm, but the present disclosure is not limited thereto. Because a critical thickness representing the ferroelectric characteristics may change for each ferroelectric material, the thickness of the ferroelectric material film may change depending on a ferroelectric material.

As an example, the first gate insulating film 130 may include one ferroelectric material film. As another example, the first gate insulating film 130 may include a plurality of ferroelectric material films spaced apart from each other. The first gate insulating film 130 may have a stacked film structure in which a plurality of ferroelectric material films and a plurality of paraelectric material films are alternately stacked.

The first gate capping pattern 145 may be disposed on an upper surface of the first gate electrode 120 and upper surfaces of the first gate spacers 140. The first gate capping pattern 145 may include, for example, at least one of silicon nitride (SiN), silicon oxynitride (SiON), silicon oxide (SiO$_2$), silicon carbonitride (SiCN), silicon oxycarbonitride (SiOCN), or combinations thereof.

In some example embodiments, the first gate capping pattern 145 may be disposed between the first gate spacers 140. In this case, an upper surface of the first gate capping pattern 145 may be coplanar with the upper surfaces of the first gate spacers 140.

The first source/drain pattern 150 may be disposed on the first field insulating film 105. The first source/drain pattern 150 may be disposed in the first active region RX1.

The first source/drain patterns 150 may be disposed on the plurality of first fin-shaped patterns 110. The first source/drain pattern 150 may be connected to the plurality of first fin-shaped patterns 110. The first source/drain pattern 150 may be disposed between the first gate electrodes 120 adjacent to each other in the first direction X1.

The second source/drain pattern 250 may be disposed on the second field insulating film 106. The second source/drain pattern 250 may be disposed in the second active region RX2.

The second source/drain patterns 250 may be disposed on the plurality of second fin-shaped patterns 210. The second source/drain pattern 250 may be connected to the plurality of second fin-shaped patterns 210. The second source/drain pattern 250 may be disposed between the second gate electrodes 220 adjacent to each other in the third direction X2.

Because the first source/drain pattern 150 is connected to the plurality of first fin-shaped patterns 110 and the second source/drain pattern 250 is connected to the plurality of second fin-shaped patterns 210, each of the first source/drain pattern 150 and the second source/drain pattern 250 may be a shared source/drain pattern.

The first source/drain pattern 150 and the second source/drain pattern 250 may be included in sources/drains of transistors using the first fin-shaped patterns 110 and the second fin-shaped patterns 210 as channel regions, respectively.

The first source/drain pattern 150 may include bottom surfaces 150BS, sidewalls 150SW, and connection surfaces 150CS. The first source/drain pattern 150 may be connected to the respective first fin-shaped patterns 110 through the bottom surfaces 150BS of the first source/drain pattern. The connection surface 150CS of the first source/drain pattern may connect adjacent bottom surfaces 150BS of the first source/drain pattern to each other. It has been illustrated in the drawings that the bottom surfaces 150BS of the first source/drain pattern are curved surfaces, but the present disclosure is not limited thereto.

The number of bottom surfaces 150BS of the first source/drain pattern included in the first source/drain pattern 150 is the same as the number of first fin-shaped patterns 110. The first source/drain pattern 150 includes a plurality of bottom surfaces 150BS of the first source/drain pattern. The number of connection surfaces 150CS of the first source/drain pattern included in the first source/drain pattern 150 is one less than the number of first fin-shaped patterns 110. The first source/drain pattern 150 includes one or more connection surfaces 150CS of the first source/drain pattern.

The sidewalls 150SW of the first source/drain pattern when view in the first direction X1 may extend in the fifth direction Z. The sidewalls 150SW of the first source/drain pattern may be directly connected to the bottom surfaces 150BS of the first source/drain pattern. The sidewalls 150SW of the first source/drain pattern may include lower sidewalls 150SW1 and upper sidewalls 150SW2.

The lower sidewalls 150SW1 of the first source/drain pattern may be directly connected to the bottom surfaces 150BS of the first source/drain pattern. A facet crossing point of the first source/drain pattern may be a point where the lower sidewall 150SW1 of the first source/drain pattern and the upper sidewall 150SW2 of the first source/drain pattern meet. A width of the first source/drain pattern 150 in the second direction Y1 between the lower sidewalls 150SW1 of the first source/drain pattern may increase as a position in the first source/drain pattern 150 becomes distant from the substrate 100. A width of the first source/drain pattern 150 in the second direction Y1 between the upper sidewalls 150SW2 of the first source/drain pattern may decrease as a position in the first source/drain pattern 150 becomes distant from the substrate 100. The facet crossing point of the first source/drain pattern may be a point where the width of the first source/drain pattern 150 in the second direction Y1 stops to increase and then starts to decrease as the first source/drain pattern 150 becomes distant from the substrate 100.

The first source/drain pattern 150 may include a plurality of first lower epitaxial regions 151, one or more connection semiconductor regions 153, and a first upper epitaxial region 152.

The first lower epitaxial region 151 may be disposed on each of the first fin-shaped patterns 110. The first source/drain pattern 150 may be connected to the first fin-shaped patterns 110 through the first lower epitaxial regions 151. The first lower epitaxial regions 151 may define the bottom surfaces 150BS of the first source/drain pattern.

The connection semiconductor regions 153 extend along upper surfaces of the first field insulating film 105. For example, the connection semiconductor regions 153 may extend along the upper surfaces 105a_US of the first inner field insulating film. The connection semiconductor regions 153 may be in contact with the first lower epitaxial regions 151. The connection semiconductor regions 153 may define the connection surfaces 150CS of the first source/drain pattern.

In FIG. 6, the connection semiconductor region 153 may include a facet 153FC having a specific angle. In FIG. 7, the connection semiconductor region 153 does not include the facet. The following description will be mainly provided with reference to FIG. 6.

The first upper epitaxial region 152 may be disposed on the first lower epitaxial regions 151 and the connection semiconductor regions 153. The first upper epitaxial region 152 may connect the first lower epitaxial regions 151 and the connection semiconductor regions 153 to each other. The first upper epitaxial region 152 is disposed on the plurality of first fin-shaped patterns 110. The first upper epitaxial region 152 is formed over the plurality of first fin-shaped patterns 110.

Each of the first lower epitaxial regions 151, the first upper epitaxial region 152, and the connection semiconductor regions 153 may include silicon-germanium. The first lower epitaxial regions 151 and the first upper epitaxial region 152 may be silicon-germanium patterns grown using an epitaxial process. The connection semiconductor regions 153 may be formed by migration of portions of the first upper epitaxial region 152 in a manufacturing process.

A fraction of germanium in the first lower epitaxial region 151 is smaller than a fraction of germanium in the first upper epitaxial region 152. A fraction of germanium in the connection semiconductor region 153 is smaller than the fraction of germanium in the first upper epitaxial region 152. As an example, the fraction of germanium in the first lower epitaxial region 151 may be greater than the fraction of germanium in the connection semiconductor region 153. As another example, the fraction of germanium in the first lower epitaxial region 151 may be the same as the fraction of germanium in the connection semiconductor region 153. As still another example, the fraction of germanium in the first lower epitaxial region 151 may be smaller than the fraction of germanium in the connection semiconductor region 153.

The second source/drain pattern 250 may include bottom surfaces 250BS, sidewalls 250SW, and connection surfaces 250CS. The second source/drain pattern 250 may be connected to the respective second fin-shaped patterns 210 through the bottom surfaces 250BS of the second source/drain pattern. The connection surface 250CS of the second source/drain pattern may connect adjacent bottom surfaces 250BS of the second source/drain pattern to each other. It has been illustrated in the drawings that the bottom surfaces 250BS of the second source/drain pattern are curved surfaces, but the present disclosure is not limited thereto.

The number of bottom surfaces 250BS of the second source/drain pattern included in the second source/drain pattern 250 is the same as the number of second fin-shaped patterns 210. The second source/drain pattern 250 includes a plurality of bottom surfaces 250BS of the second source/drain pattern. The number of connection surfaces 250CS of the second source/drain pattern included in the second source/drain pattern 250 is one less than the number of second fin-shaped patterns 210. The second source/drain pattern 250 includes one or more connection surfaces 250CS of the second source/drain pattern.

The sidewalls 250SW of the second source/drain pattern when viewed in the third direction X2 may extend in the fifth direction Z. The sidewalls 250SW of the second source/drain pattern may be directly connected to the bottom surfaces 250BS of the second source/drain pattern. The sidewalls 250SW of the second source/drain pattern may include lower sidewalls 250SW1 and upper sidewalls 250SW2.

The lower sidewalls 250SW1 of the second source/drain pattern may be directly connected to the bottom surfaces 250BS of the second source/drain pattern. A facet crossing point of the second source/drain pattern may be a point where the lower sidewall 250SW1 of the second source/drain pattern and the upper sidewall 250SW2 of the second source/drain pattern meet. A width of the second source/drain pattern 150 in the fourth direction Y2 between the lower sidewalls 250SW1 of the second source/drain pattern may increase as a position in the second source/drain pattern 250 becomes distant from the substrate 100. A width of the second source/drain pattern 150 in the fourth direction Y2 between the upper sidewalls 250SW2 of the second source/drain pattern may decrease as a position in the second source/drain pattern 250 becomes distant from the substrate 100. The facet crossing point of the second source/drain pattern may be a point where the width of the second source/drain pattern 250 in the fourth direction Y2 stops to increase and then starts to decrease as the second source/drain pattern 250 becomes distant from the substrate 100.

The second source/drain pattern 250 may include a plurality of second lower epitaxial regions 251 and a second upper epitaxial region 252.

The second lower epitaxial region 251 may be disposed on each of the second fin-shaped patterns 210. The second source/drain pattern 250 may be connected to the second fin-shaped patterns 210 through the second lower epitaxial regions 251. The second lower epitaxial regions 251 may define the bottom surfaces 250BS of the second source/drain pattern.

The second upper epitaxial region 252 may be disposed on the second lower epitaxial regions 251. The second upper epitaxial region 252 may provide connection between the second lower epitaxial regions 251 spaced apart from each other. The second upper epitaxial region 252 is disposed on the plurality of second fin-shaped patterns 210. The second upper epitaxial region 252 is formed over the plurality of second fin-shaped patterns 210.

Each of the second lower epitaxial regions 251 and the second upper epitaxial region 252 may include silicon-germanium. The second lower epitaxial regions 251 and the second upper epitaxial region 252 may be silicon-germanium patterns grown using an epitaxial process. A fraction of germanium in the second lower epitaxial region 251 is smaller than a fraction of germanium in the second upper epitaxial region 252.

In the first source/drain pattern 150, one or more of the connection surfaces 150CS of the first source/drain pattern are in entire contact with the upper surfaces of the first field insulating film 105. More specifically, one or more of the connection surfaces 150CS of the first source/drain pattern 150 are in entire contact with the upper surfaces 105$a$_US of the first inner field insulating film 105$a$. For example, one or more of the connection surfaces 150CS of the first source/drain pattern are in direct contact with the upper surfaces 105$a$_US of the first inner field insulating film 105$a$.

Here, the phrase "in entire contact with" means that there is no air gap between the connection surface 150CS of the first source/drain pattern 150 and the upper surface 105$a$_US of the first inner field insulating film 105$a$ in a cross-sectional view as illustrated in FIG. 2.

In the semiconductor device according to some example embodiments, all the connection surfaces 150CS of the first source/drain pattern 150 are in entire contact with the upper surfaces 105$a$_US of the first inner field insulating film 105$a$. For example, the first inner field insulating film 105$a$ may include a first portion 105$a$_1, a second portion 105$a$_2, and a third portion 105$a$_3. The second portion 105$a$_2 of the first inner field insulating film 105$a$ is disposed between the first portion 105$a$_1 of the first inner field insulating film 105$a$ and the third portion 105$a$_3 of the first inner field insulating film 105$a$. The connection surface 150CS of the first source/drain pattern 150 corresponding to the first portion 105$a$_1 of the first inner field insulating film 105$a$ is in entire contact with an upper surface 105$a$_US1 of the first portion 105$a$_1 of the first inner field insulating film 105$a$. In other words, the entire upper surface 105$a$_US1 of the first portion 105$a$_1 of the first inner field insulating film 105$a$ is in contact with the first source/drain pattern 150. The connection surface 150CS of the first source/drain pattern 150 corresponding to the second portion 105$a$_2 of the first inner field insulating film is in entire contact with an upper surface 105$a$_US2 of the second portion 105$a$_2 of the first inner field insulating film 105$a$. The connection surface 150CS of the first source/drain pattern 150 corresponding to the third portion 105$a$_3 of the first inner field insulating film 105$a$ is in entire contact with an upper surface 105$a$_US3 of the third portion 105$a$_3 of the first inner field insulating film 105$a$.

One or more first air gaps AG_L may be disposed between the second field insulating film 106 and the second source/drain pattern 250. The first air gaps AG_L may be disposed between the second inner field insulating film 106$a$ and the second source/drain pattern 250. The first air gaps AG_L may be defined between the upper surface 106$a$_US of the second inner field insulating film 106$a$ and the connection surfaces 250CS of the second source/drain pattern 250. The first air gap AG_L may have a first air gap width AG_W1 in the fourth direction Y2 and a first air gap height AG_H1 in the fifth direction Z.

For example, the first air gaps AG_L may be disposed between all the connection surfaces 250CS of the second source/drain pattern 250 and the upper surface 106$a$_US of the second inner field insulating film 106$a$. The number of first air gaps AG_L is the same as the number of connection surfaces 250CS of the second source/drain pattern 250. The number of first air gaps AG_L is one less than the number of second fin-shaped patterns 210.

In FIG. 6, the second portion 105$a$_2 of the first inner field insulating film 105$a$ may be immediately adjacent to the first portion 105$a$_1 of the first inner field insulating film 105$a$. Here, the phrase "immediately adjacent" means that another first inner field insulating film 105$a$ is not disposed between the second portion 105$a$_2 of the first inner field insulating film 105$a$ and the first portion 105$a$_1 of the first inner field insulating film 105$a$. The second portion 105$a$_2 of the first inner field insulating film 105$a$ may be immediately adjacent to the third portion 105$a$_3 of the first inner field insulating film 105$a$.

On the basis of a bottom surface of the first fin trench FT1, a height of the upper surface 105$a$_US1 of the first portion 105$a$_1 of the first inner field insulating film 105$a$ may be a first height H1. A height of the upper surface 105$a$_US2 of the second portion 105$a$_2 of the first inner field insulating film 105$a$ may be a second height H2. A height of the upper surface 105$a$_US3 of the third portion 105$a$_3 of the first inner field insulating film 105$a$ may be a third height H3. Here, a height of the upper surface 105$a$_US of the first inner field insulating film 105$a$ may be a height from the bottom surface of the first fin trench FT1 to the lowest point in the upper surface 105$a$_US of the first inner field insulating film 105$a$.

The connection surfaces 150CS of the first source/drain pattern 150 are in contact with the upper surfaces 105$a$_US of the first inner field insulating film 105$a$. A height from the bottom of the first fin trench FT1 to the first source/drain pattern 150 in contact with the first portion 105$a$_1 of the first inner field insulating film 105$a$ may be the first height H1. A height from the bottom of the first fin trench FT1 to the first source/drain pattern 150 in contact with the second portion 105$a$_2 of the first inner field insulating film 105$a$ may be the second height H2. A height from the bottom of the first fin trench FT1 to the first source/drain pattern 150 in contact with the third portion 105$a$_3 of the first inner field insulating film 105$a$ may be the third height H3.

In the semiconductor device according to some example embodiments, the height H2 of the upper surface 105$a$_US2 of the second portion 105$a$_2 of the first inner field insulating film 105$a$ may be the same as the height H1 of the upper surface 105$a$_US1 of the first portion 105$a$_1 of the first inner field insulating film 105$a$. The height H2 of the upper surface 105$a$_US2 of the second portion 105$a$_2 of the first inner field insulating film 105$a$ may be the same as the height H3 of the upper surface 105$a$_US3 of the third portion 105$a$_3 of the first inner field insulating film 105$a$.

A first etch stop film 195 may extend along the upper surface 105$b$_US of the first outer field insulating film 105$b$, portions of the sidewalls 150SW of the first source/drain pattern 150, the upper surface 106$b$_US of the second outer field insulating film 105$b$, and portions of the sidewalls 250SW of the second source/drain pattern 250.

The first etch stop film 195 may include a material having an etch selectivity with respect to a first interlayer insulating film 191 to be described later. The first etch stop film 195 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), or combinations thereof.

A first interlayer insulating film 191 may be disposed on the first etch stop film 195. An upper surface of the first interlayer insulating film 191 may be coplanar with an upper surface of the first gate capping pattern 145.

A first source/drain contact 170 may be disposed on the first source/drain pattern 150. The first source/drain contact 170 is connected to the first source/drain pattern 150. The first source/drain contact 170 may be disposed in the first interlayer insulating film 191.

An upper surface of the first source/drain contact 170 may be coplanar with the upper surface of the first interlayer insulating film 191. Further, the upper surface of the first source/drain contact 170 may be coplanar with the upper surface of the gate capping pattern 145.

A second source/drain contact 270 may be disposed on the second source/drain pattern 250. The second source/drain contact 270 is connected to the second source/drain pattern 250. The second source/drain contact 270 may be disposed in the first interlayer insulating film 191.

An upper surface of the second source/drain contact 270 may be coplanar with the upper surface of the first interlayer insulating film 191.

A first silicide film 155 may be disposed between the first source/drain contact 170 and the first source/drain pattern 150. A second silicide film 255 may be formed between the second source/drain contact 270 and the second source/drain pattern 250. Each of the first silicide film 155 and the second silicide film 155 may include a metal silicide material.

In some example embodiments, each of the first source/drain contact 170 and the second source/drain contact 270 may have an L shape. As another example, each of the first source/drain contact 170 and the second source/drain contact 270 may have a T shape rotated by 180°.

The first gate contact 175 may be disposed on the first gate electrode 120. The first gate contact 175 is connected to the first gate electrode 120. The first gate contact 175 may be disposed in the first gate capping pattern 145. An upper surface of the first gate contact 175 may be coplanar with the upper surface of the first gate capping pattern 145.

The second gate contact 275 may be disposed on the second gate electrode 220. The second gate contact 275 is connected to the second gate electrode 220. Although not illustrated in the drawings, the second gate contact 275 may be disposed in a gate capping pattern on the second gate electrode 220.

Each of the first source/drain contact 170, the second source/drain contact 270, the first gate contact 175, and the second gate contact 275 may include a conductive material, and may include, for example, at least one of a metal, metal nitride, metal carbonitride, a two-dimensional (2D) material, or a conductive semiconductor material. It has been illustrated in the drawings that each of the first source/drain contact 170, the second source/drain contact 270, and the first gate contact 175 is a single layer, but it is only for convenience of explanation, and the present disclosure is not limited thereto. As an example, each of the first source/drain contact 170, the second source/drain contact 270, the first gate contact 175, and the second gate contact 275 may include a contact barrier film and a contact filling film filling a space defined by the contact barrier film. As another example, each of the first source/drain contact 170, the second source/drain contact 270, the first gate contact 175, and the second gate contact 275 may include only a contact filling film without a contact barrier film.

A second interlayer insulating film 192 may be disposed on the first interlayer insulating film 191. A second etch stop layer 196 may be disposed between the second interlayer insulating film 192 and the first interlayer insulating film 191.

Each of the first interlayer insulating film 191 and the second interlayer insulating film 192 may include, for example, at least one of silicon oxide, silicon nitride, silicon oxynitride, or a low-k material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or combinations thereof, but the present disclosure is not limited thereto.

The second etch stop film 196 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN), aluminum oxycarbide (AlOC), or combinations thereof.

Wiring structures 205 may be disposed in the second interlayer insulating film 192. The wiring structure 205 may include a via plug 206 and a wiring line 207. The wiring lines 207 may be connected to the source/drain contacts 170 and 270 and the gate contacts 175 and 275 through the via plugs 206.

The via plug 206 and the wiring line 207 may be formed through different manufacturing processes. A boundary between the via plug 206 and the wiring line 207 may be apparent. In some example embodiments, the via plug 206 and the wiring line 207 may have an integral structure. In this case, the boundary between the via plug 206 and the wiring line 207 may not be apparent.

Each of the via plug 206 and the wiring line 207 may include a conductive material, and may include, for example, at least one of a metal, metal nitride, metal carbonitride, a two-dimensional (2D) material, or a conductive semiconductor material.

FIGS. 8 to 12 are views for describing semiconductor devices according to some example embodiments, respectively. For convenience of explanation, contents different from those described with reference to FIGS. 1 to 7 will be mainly described. For reference, FIGS. 8 to 12 are enlarged views of part P of FIG. 2.

Figure 8:
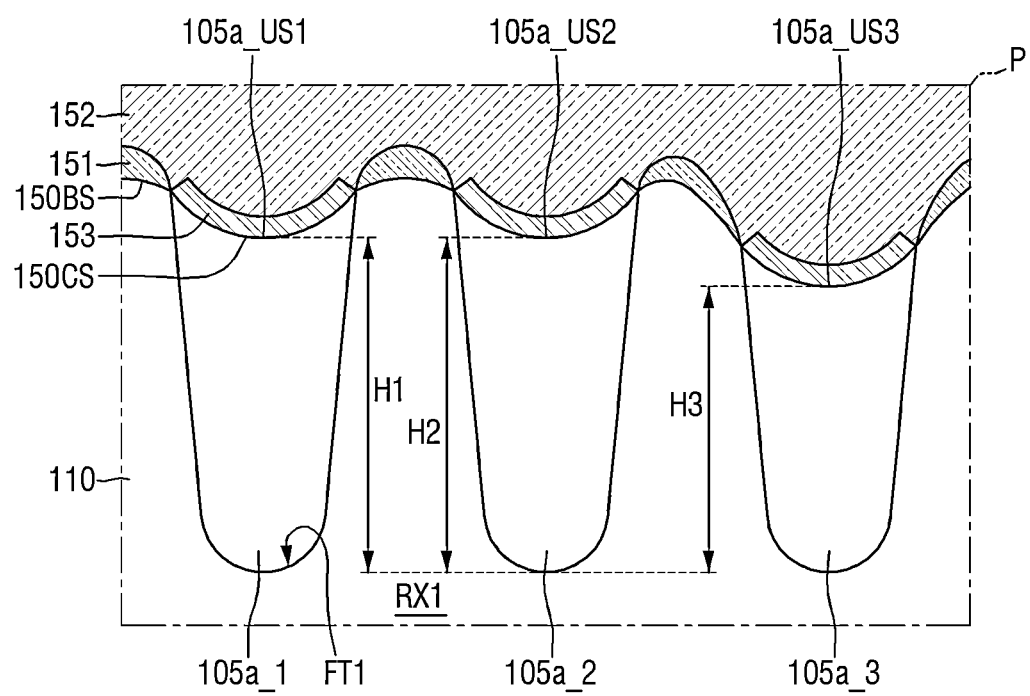
FIGS. 8 to 12 are views for describing semiconductor devices according to some example embodiments, respectively.
Figure 9:
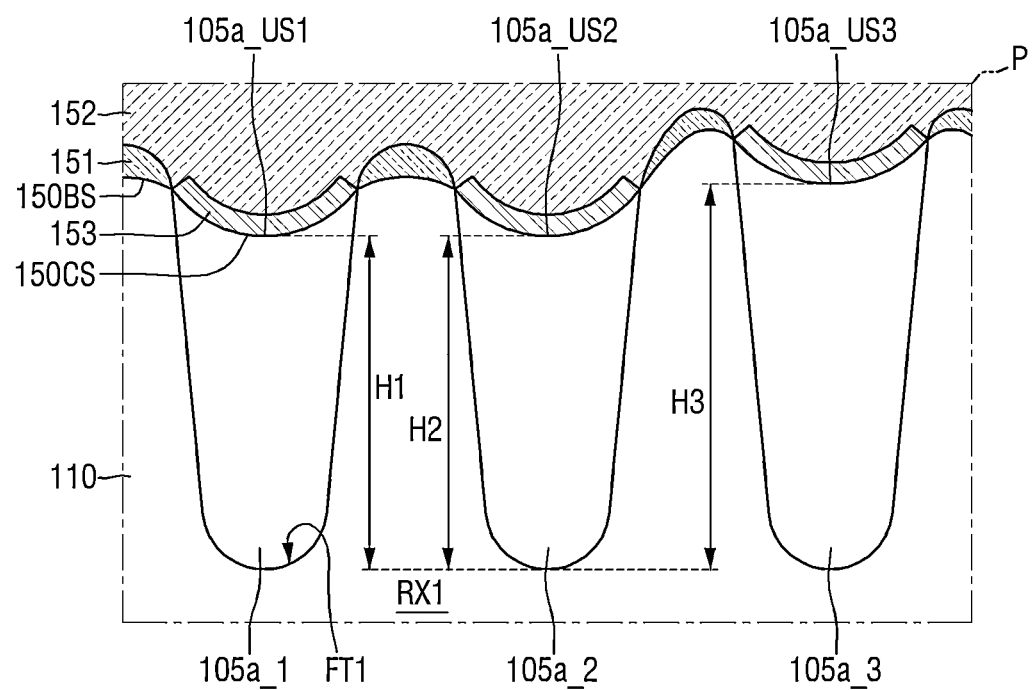

Referring to FIGS. 8 and 9, in semiconductor devices according to some example embodiments, the height H1 of the upper surface 105a_US1 of the first portion 105a_1 of the first inner field insulating film 105a may be the same as the height H2 of the upper surface 105a_US2 of the second portion 105a_2 of the first inner field insulating film 105a.

The height H2 of the upper surface 105a_US2 of the second portion 105a_2 of the first inner field insulating film 105a may be different from the height H3 of the upper surface 105a_US3 of the third portion 105a_3 of the first inner field insulating film 105a.

In FIG. 8, the height H2 of the upper surface 105a_US2 of the second portion 105a_2 of the first inner field insulating film 105a may be greater than the height H3 of the upper surface 105a_US3 of the third portion 105a_3 of the first inner field insulating film 105a.

In FIG. 9, the height H2 of the upper surface 105a_US2 of the second portion 105a_2 of the first inner field insulating film 105a may be smaller than the height H3 of the upper surface 105a_US3 of the third portion 105a_3 of the first inner field insulating film 105a.

Figure 10:
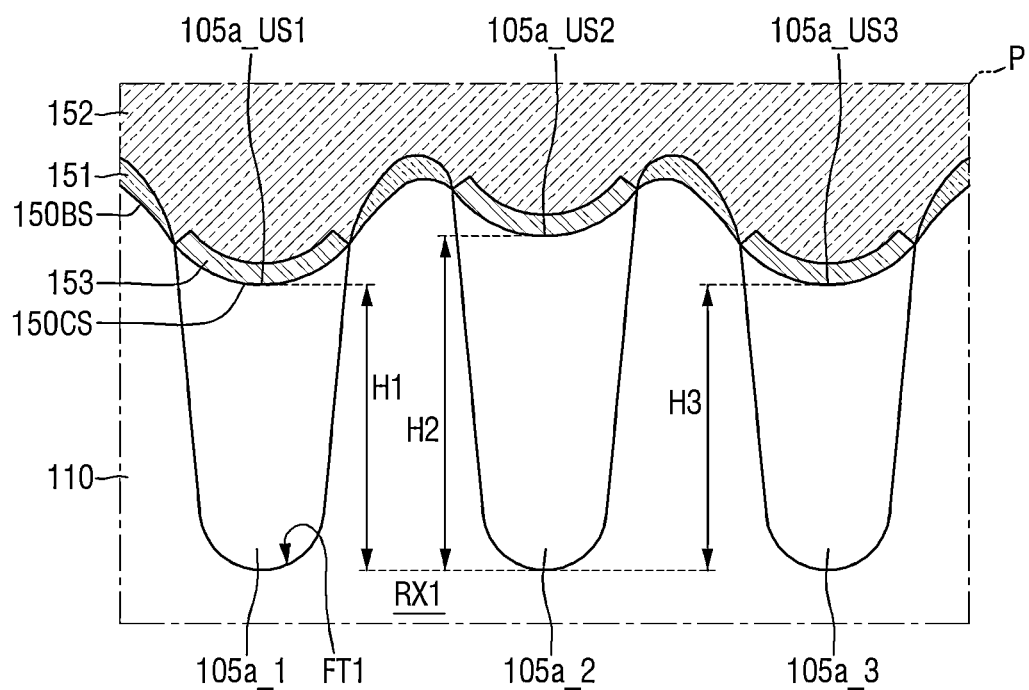
Figure 11:
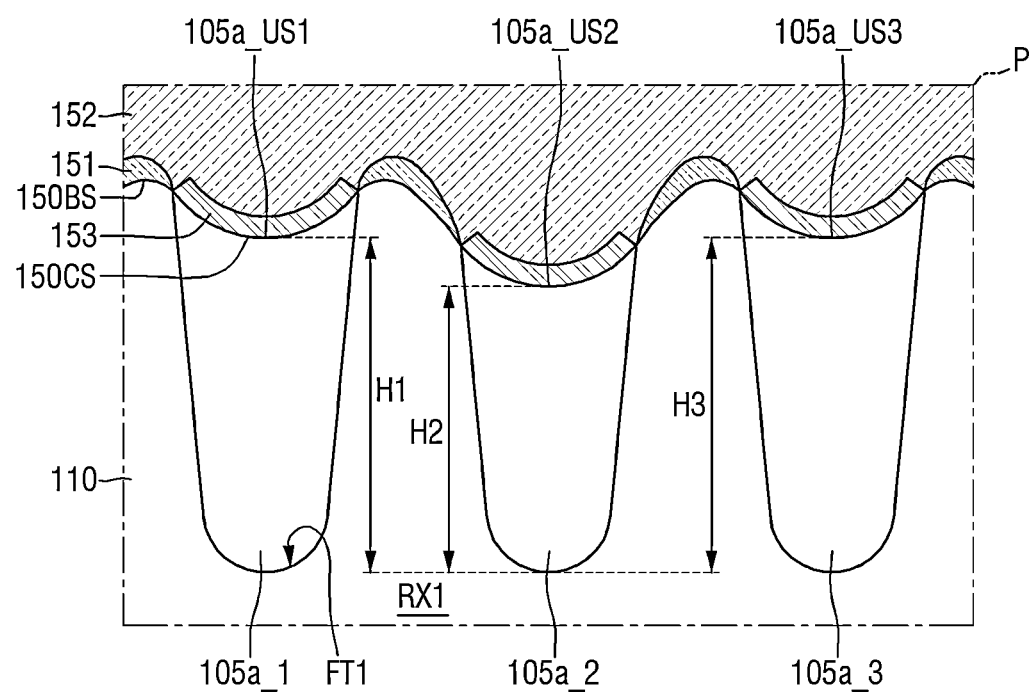
Figure 12:
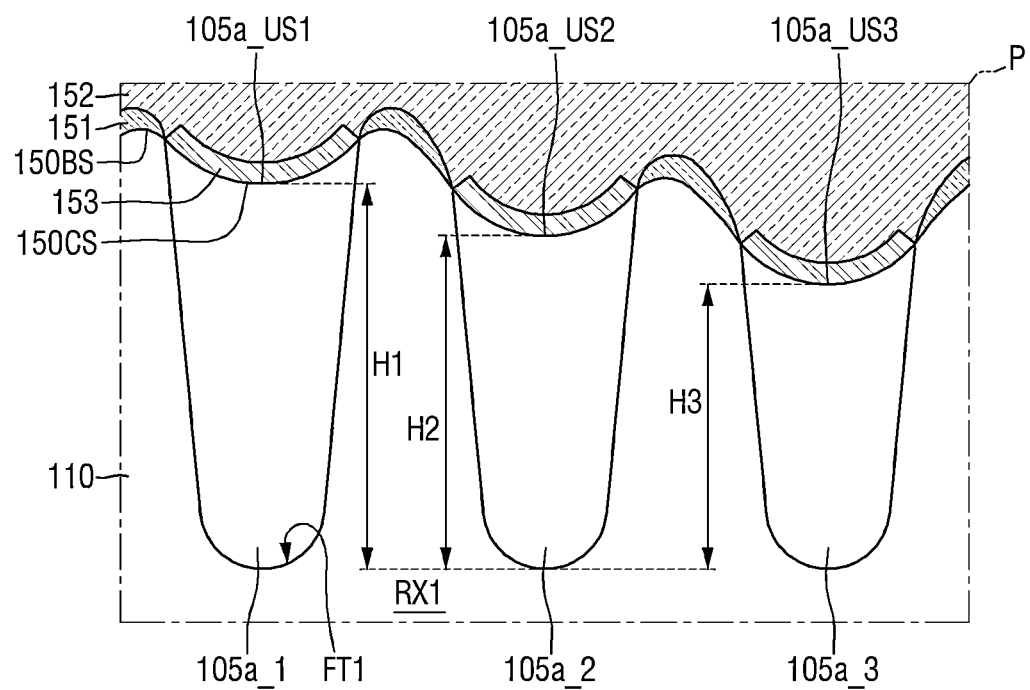

Referring to FIGS. 10 to 12, in semiconductor devices according to some example embodiments, the height H2 of the upper surface 105a_US2 of the second portion 105a_2 of the first inner field insulating film 105a may be different from the height H3 of the upper surface 105a_US3 of the third portion 105a_3 of the first inner field insulating film 105a.

The height H1 of the upper surface 105a_US1 of the first portion 105a of the first inner field insulating film 105a_1 may be different from the height H2 of the upper surface 105a_US2 of the second portion 105a_2 of the first inner field insulating film 105a.

In FIG. 10, the height H2 of the upper surface 105a_US2 of the second portion 105a_2 of the first inner field insulating film 105a may be greater than the height H3 of the upper surface 105a_US3 of the third portion 105a_3 of the first inner field insulating film 105a.

The height H2 of the upper surface 105a_US2 of the second portion 105a_2 of the first inner field insulating film 105a may be greater than the height H1 of the upper surface 105a_US1 of the first portion 105a_1 of the first inner field insulating film 105a.

In FIG. 11, the height H2 of the upper surface 105a_US2 of the second portion 105a_2 of the first inner field insulating film 105a may be smaller than the height H3 of the upper surface 105a_US3 of the third portion 105a_3 of the first inner field insulating film 105a.

The height H2 of the upper surface 105a_US2 of the second portion 105a_2 of the first inner field insulating film 105a may be smaller than the height H1 of the upper surface 105a_US1 of the first portion 105a_1 of the first inner field insulating film 105a.

In FIG. 12, the height H2 of the upper surface 105a_US2 of the second portion 105a_2 of the first inner field insulating film 105a may be greater than the height H3 of the upper surface 105a_US3 of the third portion 105a_3 of the first inner field insulating film 105a.

The height H2 of the upper surface 105a_US2 of the second portion 105a_2 of the first inner field insulating film 105a may be smaller than the height H1 of the upper surface 105a_US1 of the first portion 105a_1 of the first inner field insulating film 105a.

Figure 13:
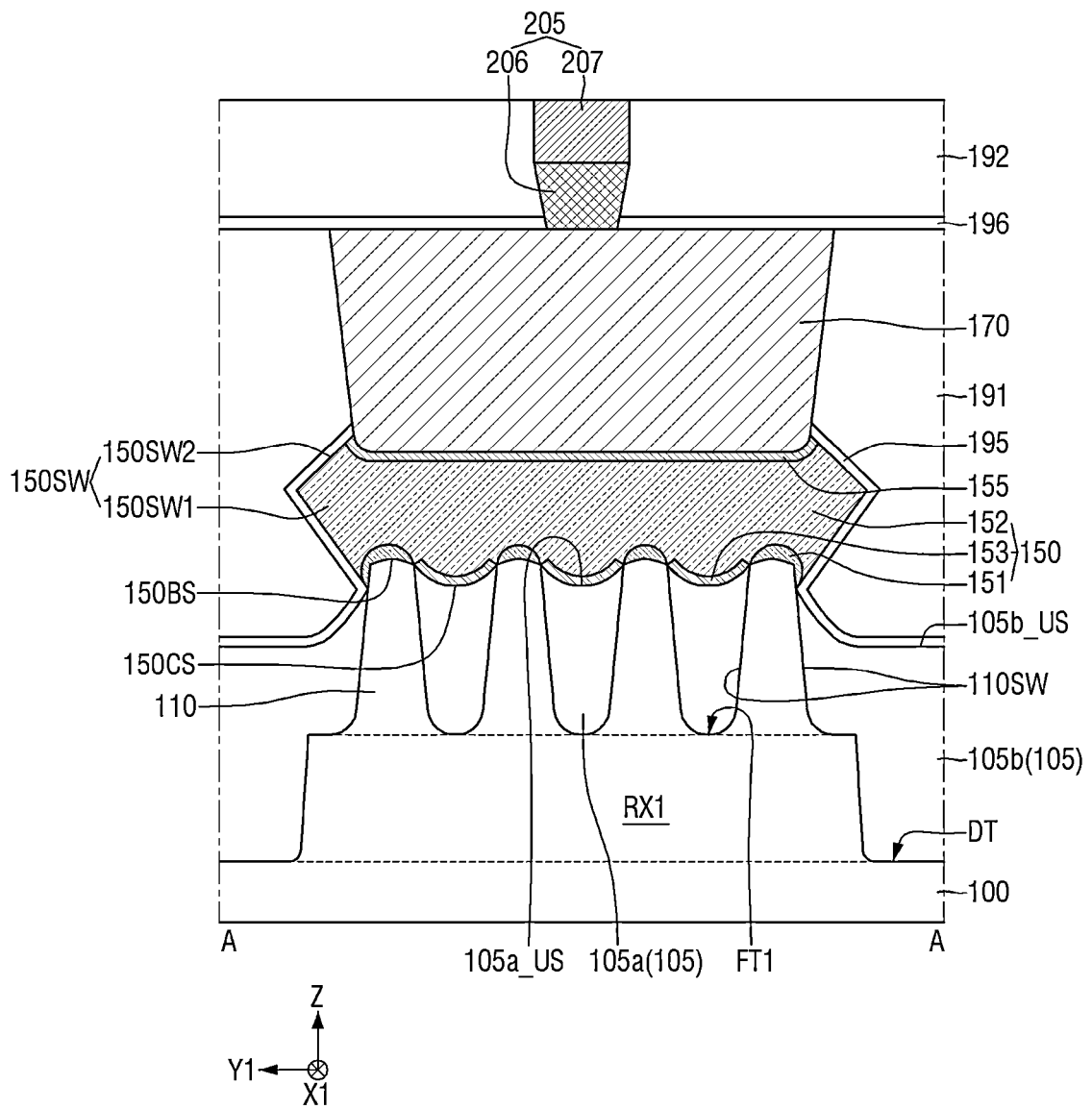
FIG. 13 is a view for describing a semiconductor device according to an example embodiment.

FIG. 13 is a view for describing a semiconductor device according to an example embodiment. For convenience of explanation, contents different from those described with reference to FIGS. 1 to 7 will be mainly described.

Referring to FIG. 13, in a semiconductor device according to an example embodiment, a portion of the sidewall 110SW of the first fin-shaped pattern disposed at the outermost portion of the first active region RX1 may be exposed from the first outer field insulating film 105b.

The first outer field insulating film 105b may not entirely cover the sidewall 110SW of the first fin-shaped pattern disposed at the outermost portion of the first active region RX1.

The first lower epitaxial region 151 may cover the sidewall 110SW of the first fin-shaped pattern exposed from the first outer field insulating film 105b.

Figure 14:
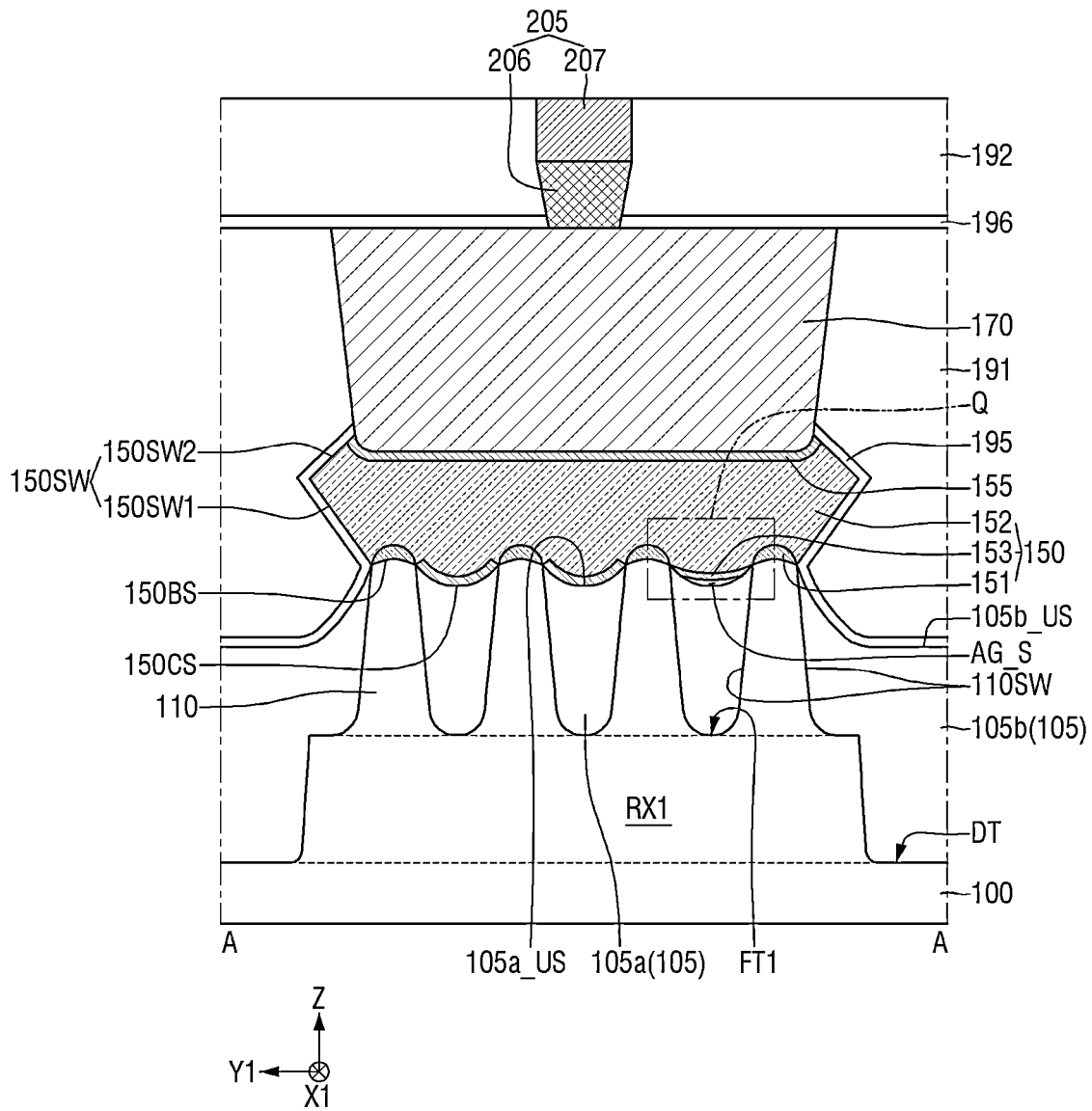
FIGS. 14 and 15 are views for describing a semiconductor device according to an example embodiment.
Figure 15:
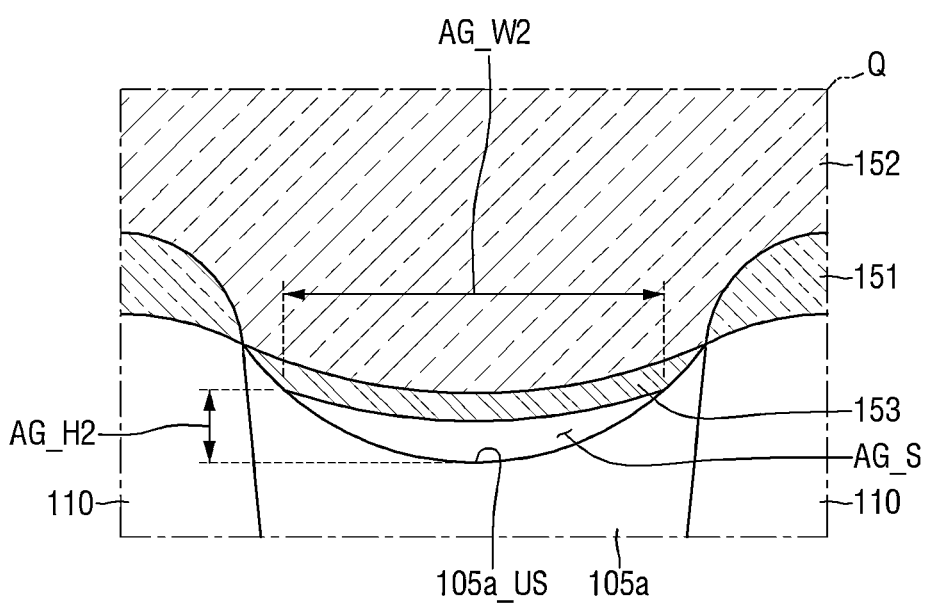
Figure 16:
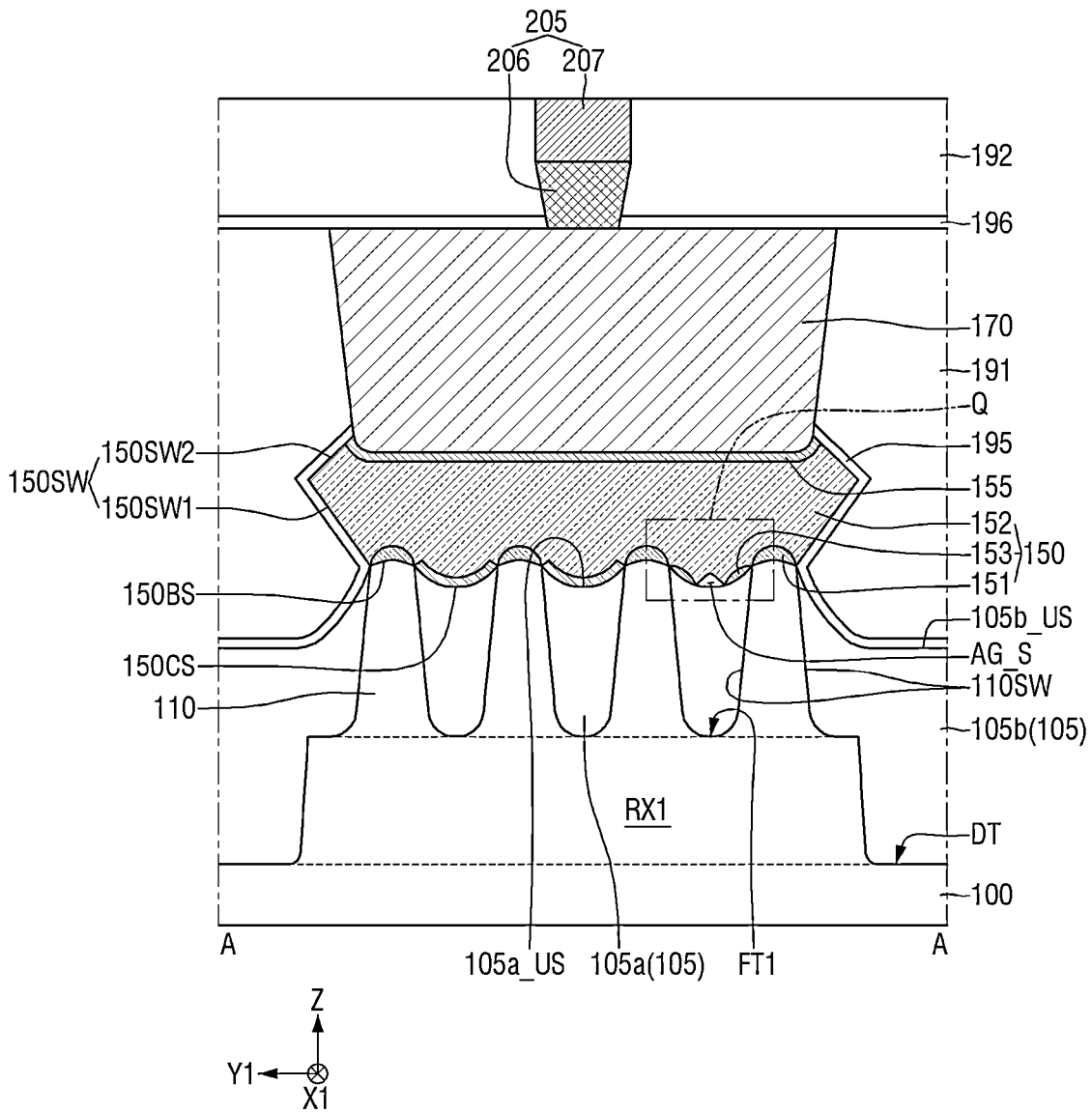
FIGS. 16 and 17 are views for describing a semiconductor device according to an example embodiment.
Figure 17:
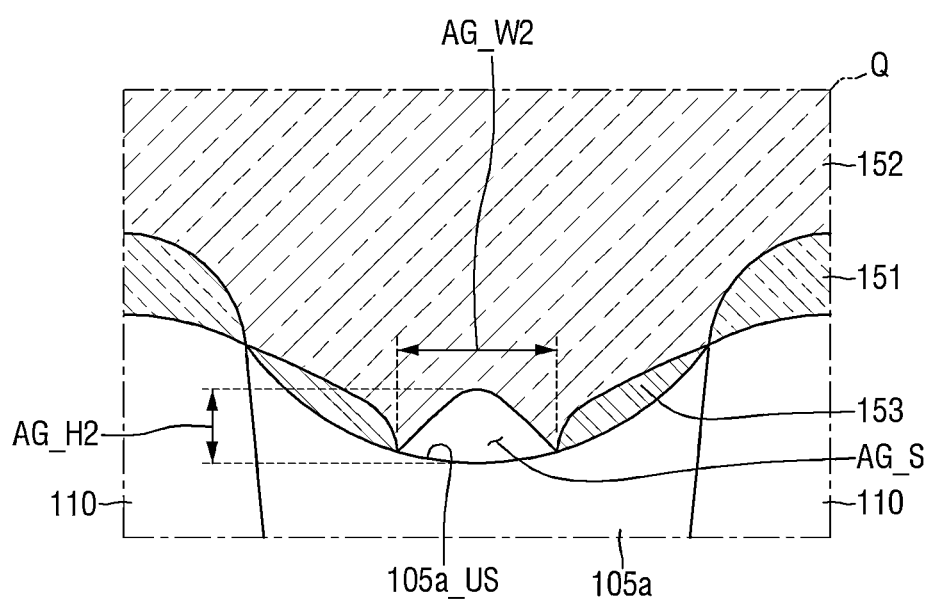

FIGS. 14 and 15 are views for describing a semiconductor device according to an example embodiment. FIGS. 16 and 17 are views for describing a semiconductor device according to an example embodiment. For convenience of expla-
nation, contents different from those described with reference to FIGS. 1 to 7 will be mainly described.

For reference, FIGS. 15 and 17 are enlarged views of part Q of FIGS. 14 and 16.

Referring to FIGS. 14 to 17, semiconductor devices according to some example embodiments may include one or more second air gaps AG_S disposed between the first source/drain pattern 150 and the first field insulating film 105.

The second air gaps AG_S may be disposed between the first inner field insulating film 105a and the first source/drain pattern 150. The second air gaps AG_S may be defined between the upper surfaces 105a_US of the first inner field insulating film 105a and the connection surfaces 150CS of the first source/drain pattern 150.

The second air gap AG_S may have a second air gap width AG_W2 in the second direction Y1 and a second air gap height AG_H2 in the fifth direction Z. A size of the second air gap AG_S is smaller than that of the first air gap AG_L (see FIG. 5). As an example, the second air gap width AG_W2 may be smaller than the first air gap width AG_W1. The second air gap height AG_H2 may be smaller than the first air gap height AG_H1. As another example, the second air gap width AG_W2 may be smaller than the first air gap width AG_W1. The second air gap height AG_H2 may be the same as the first air gap height AG_H1. As still another example, the second air gap height AG_H2 may be smaller than the first air gap height AG_H1. The second air gap width AG_W2 may be the same as the first air gap width AG_W1.

The number of second air gaps AG_S may be less than the number of connection surfaces 150CS of the first source/drain pattern 150. In other words, some of the connection surfaces 150CS of the first source/drain pattern 150 are in entire contact with corresponding ones of the upper surfaces 105a_US of the first inner field insulating film 105a. The other one or more of the connection surfaces 150CS of the first source/drain pattern 150 are not in entire contact with the upper surfaces 105a_US of the first inner field insulating film 105a.

For example, the first inner field insulating film 105a may include a first portion and a second portion spaced apart from each other in the second direction Y1. An upper surface 105a_US of the first portion 105a_1 of the first inner field insulating film 105a is in entire contact with the first source/drain pattern 150. An upper surface 105a_US of the second portion 105a_2 of the first inner field insulating film 105a is not in entire contact with the first source/drain pattern 150. The second air gap AG_S is disposed between the second portion 105a_2 of the first inner field insulating film 105a and the first source/drain pattern 150. The second air gap AG_S is not disposed between the first portion 150a_1 of the first inner field insulating film 105a and the first source/drain pattern 150.

In FIG. 15, one connection semiconductor region 153 may be disposed on the upper surface 105a_US of the first inner field insulating film 105a on which the second air gap AG_S is disposed.

In FIG. 17, a plurality of connection semiconductor regions 153 spaced apart from each other may be disposed on the upper surface 105a_US of the first inner field insulating film 105a on which the second air gap AG_S is disposed.

Shapes around the second air gap AG_S illustrated in FIGS. 15 and 17 are only examples, and the technical spirit (or concepts) of the present disclosure is not limited thereto.

Figure 18:
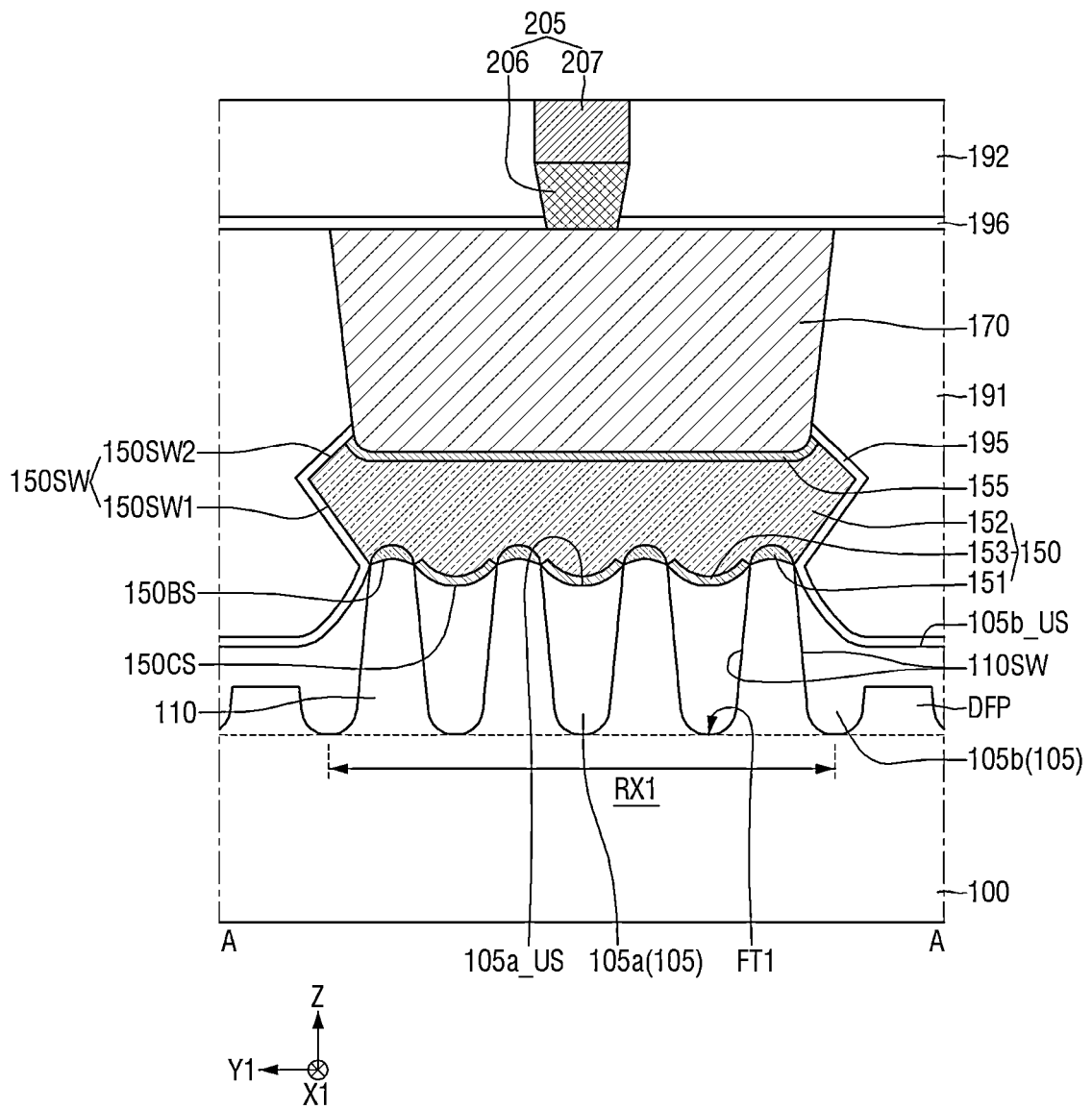
FIG. 18 is a view for describing a semiconductor device according to an example embodiment.
Figure 19:
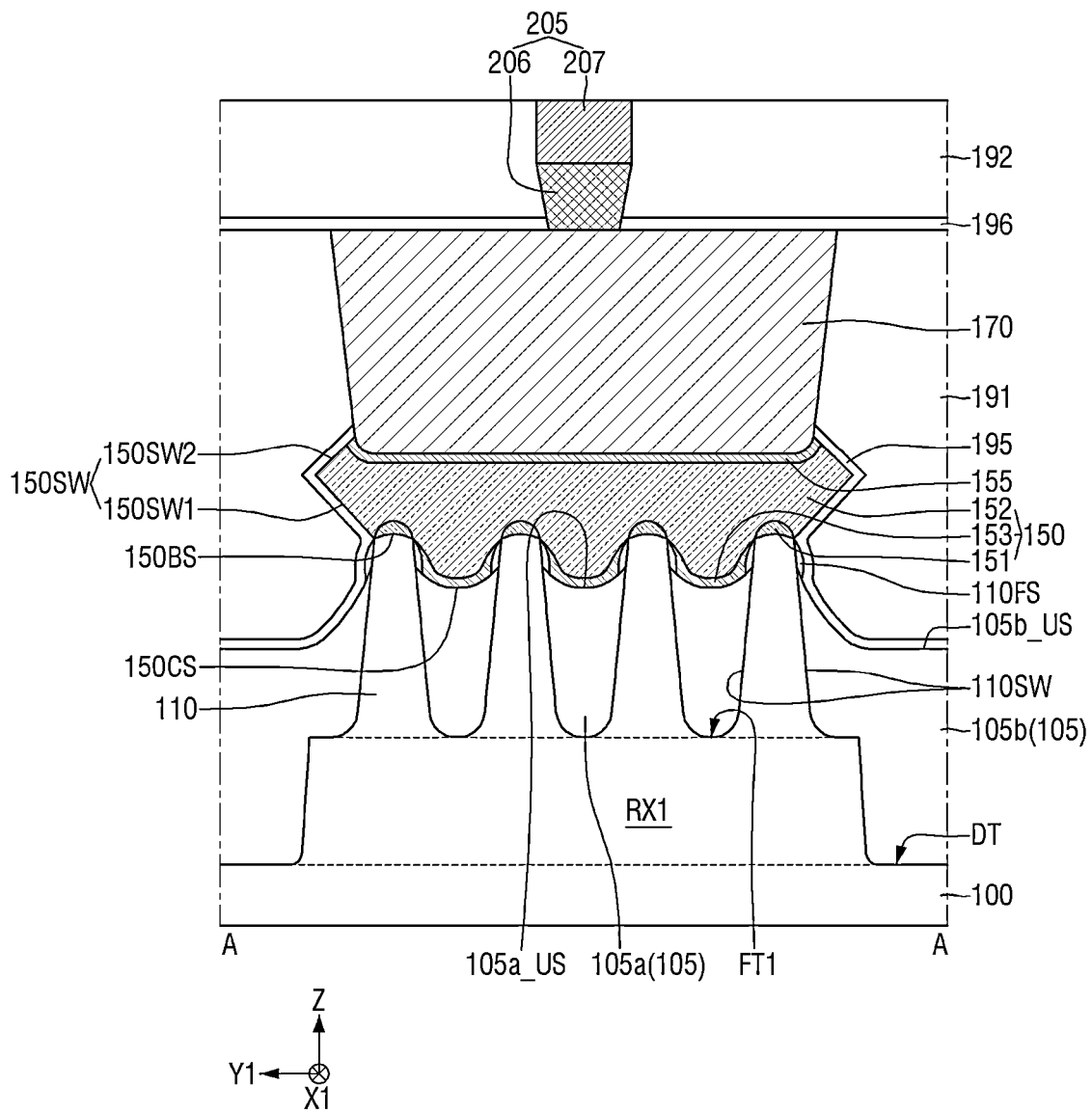
FIG. 19 is a view for describing a semiconductor device according to an example embodiment.

FIG. 18 is a view for describing a semiconductor device according to an example embodiment. FIG. 19 is a view for describing a semiconductor device according to an example embodiment. For convenience of explanation, contents different from those described with reference to FIGS. 1 to 7 will be mainly described.

Referring to FIG. 18, a semiconductor device according to an example embodiment may further include dummy protrusion patterns DFP disposed around the plurality of first fin-shaped patterns 110.

The deep trenches DT (see FIG. 2) are not formed around the plurality of first fin-shaped patterns 110. The first active region RX1 may be defined between the dummy protrusion patterns DFP.

Although not illustrated in FIGS. 18 and 19, the dummy protrusion patterns DFP may be disposed around the plurality of first fin-shaped patterns 110. The second active region RX2 (see FIG. 5) may be defined between the dummy protrusion patterns DFP.

An upper surface of the dummy protrusion pattern DFP is covered by the first field insulating film 105. For example, the upper surface of the dummy protrusion pattern DFP is covered by the first outer field insulating film 105b. The dummy protrusion pattern DFP may include a semiconductor material.

Referring to FIG. 19, a semiconductor device according to an example embodiment may further include fin spacers 110FS disposed on the sidewalls 110SW of the first fin-shaped patterns.

The fin spacers 110FS may be disposed on the first field insulating film 105. The connection semiconductor regions 153 may cover the fin spacers 110FS.

The fin spacer 110FS may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), or combinations thereof.

Although not illustrated in the drawings, fin spacers may be disposed on the sidewalls 210SW of the second fin-shaped patterns 210.

Figure 20:
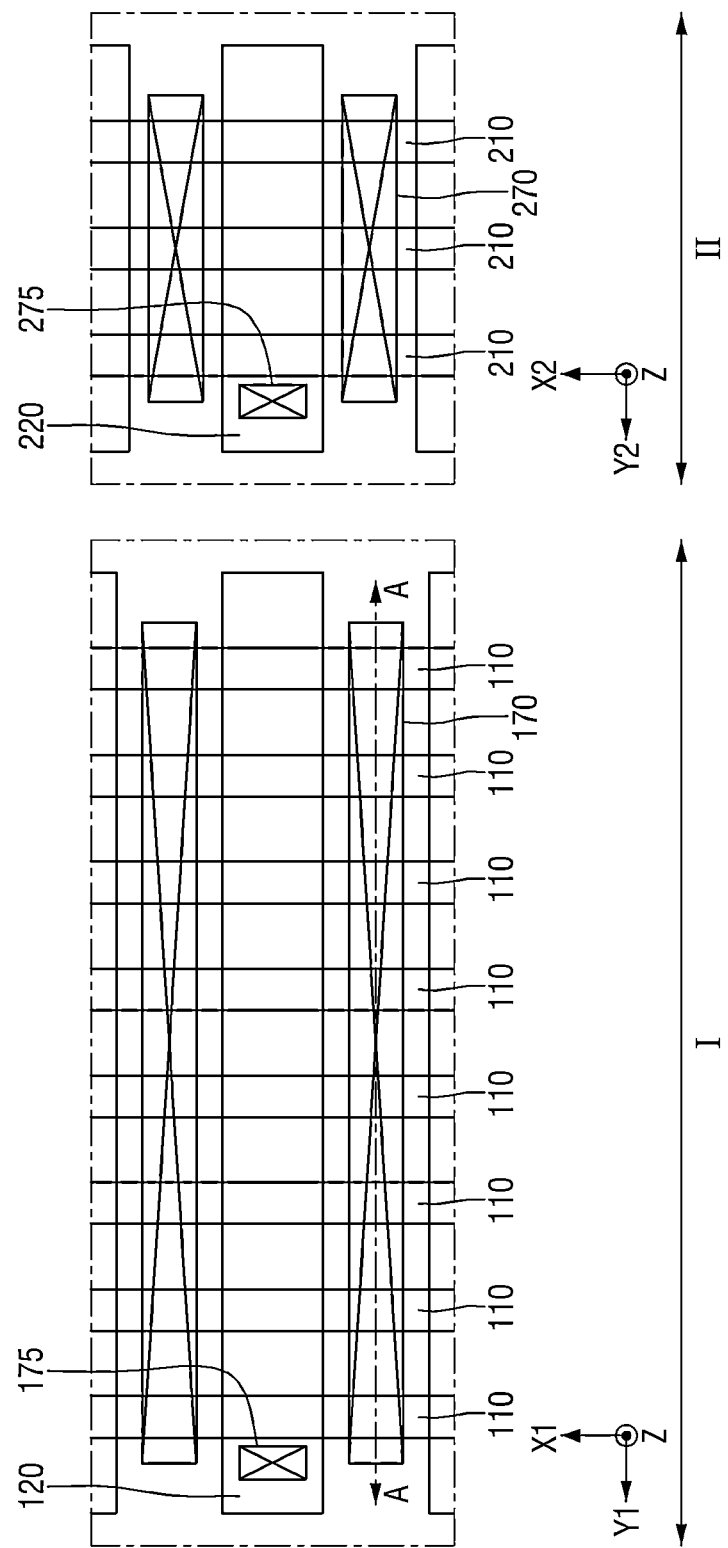
FIG. 20 is an illustrative layout diagram for describing a semiconductor device according to an example embodiment.
Figure 21:
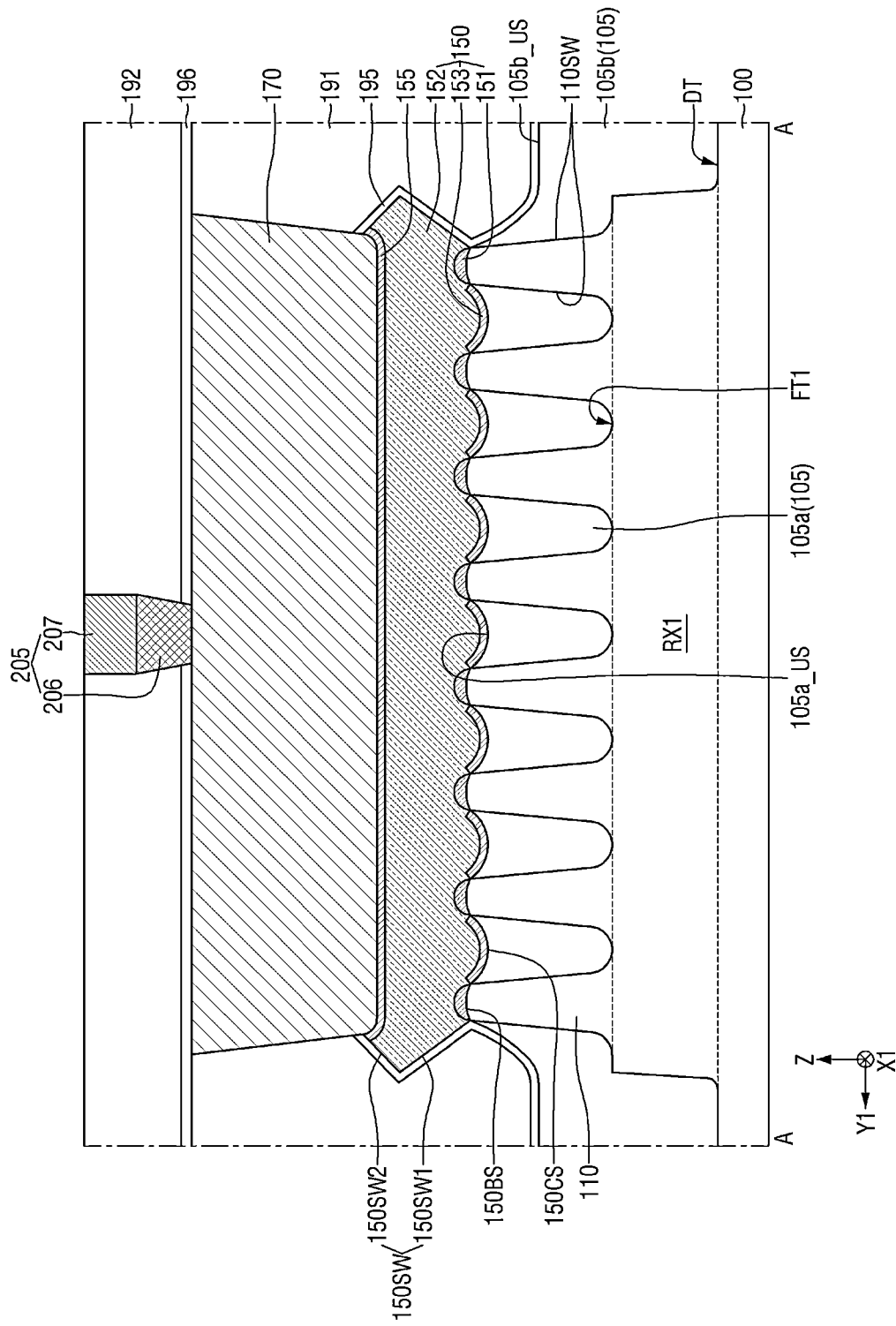
FIG. 21 is a cross-sectional view taken along line A-A of FIG. 20.

FIG. 20 is an illustrative layout diagram for describing a semiconductor device according to an example embodiment. FIG. 21 is a cross-sectional view taken along line A-A of FIG. 20. For convenience of explanation, contents different from those described with reference to FIGS. 1 to 7 will be mainly described.

Referring to FIGS. 20 and 21, the number of first fin-shaped patterns 110 disposed in the first active region RX1 is more than four.

It is illustrated in FIGS. 20 and 21 that eight first fin-shaped patterns 110 are disposed in the first active region RX1, but the present disclosure is not limited thereto.

In first fin-shaped patterns 110 may be disposed in the first active region RX1. Here, n may be a natural number of 4 or more.

The first source/drain pattern 150 is connected to the n first fin-shaped patterns 110. The first source/drain pattern 150 includes n bottom surfaces 150BS of the first source/drain pattern 150. The first source/drain pattern 150 includes n−1 connection surfaces 150CS of the first source/drain pattern 150.

n−1 first inner field insulating films 105a may be disposed between the first source/drain pattern 150 and the substrate 100. The respective first inner field insulating films 105a may fill the first fin trenches FT1.

Three of the first inner field insulating films 105a that are continuous (e.g., adjacent to each other) in the second direction Y1 among the n−1 first inner field insulating films 105a may show a height relationship between the upper surfaces 105a_US of the three first inner field insulating films as illustrated in FIGS. 6 and 8 to 12.

Further, as an example, the n−1 connection surfaces 150CS of the first source/drain pattern 150 may be in entire contact with the upper surfaces 105a_US of the first inner field insulating films 105a. As another example, some (not all) of the connection surfaces 150CS of the first source/drain pattern 150 may be in entire contact with the upper surfaces 105a_US of corresponding ones of the first inner field insulating films 105a. The second air gaps AG_S described with reference to FIGS. 14 to 17 may be disposed between the others of the connection surfaces 150CS of the first source/drain pattern 150 and the upper surfaces 105a_US of corresponding ones of the first inner field insulating films 105a.

Figure 22:
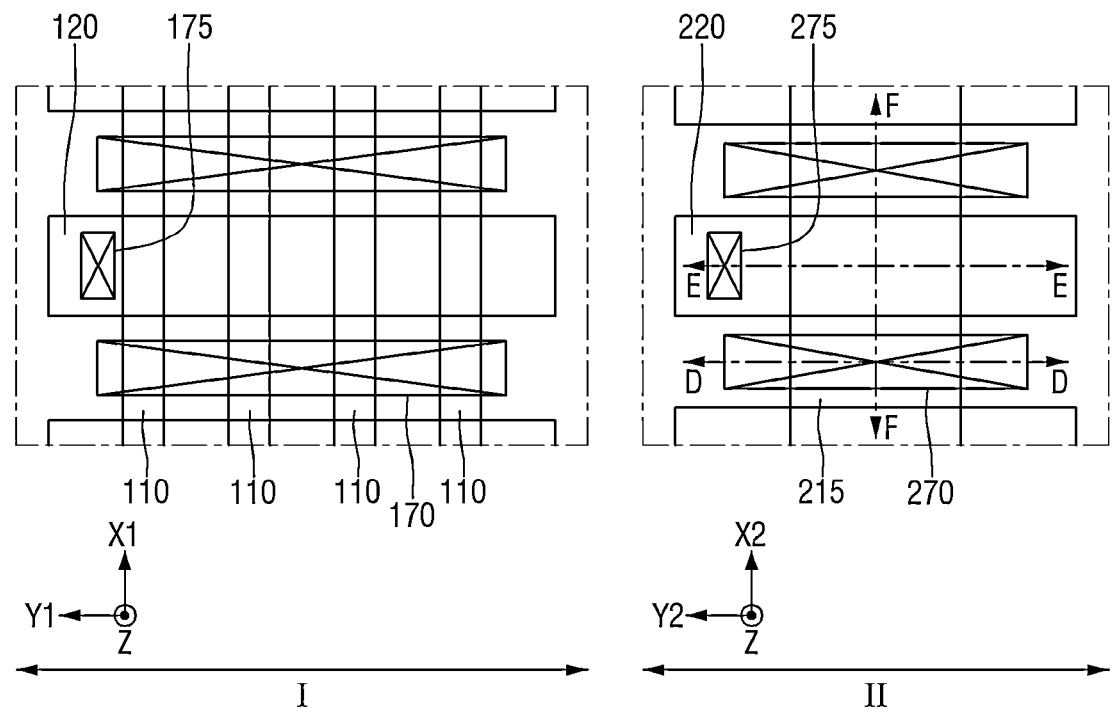
FIG. 22 is an illustrative layout diagram for describing a semiconductor device according to an example embodiment.
Figure 23:
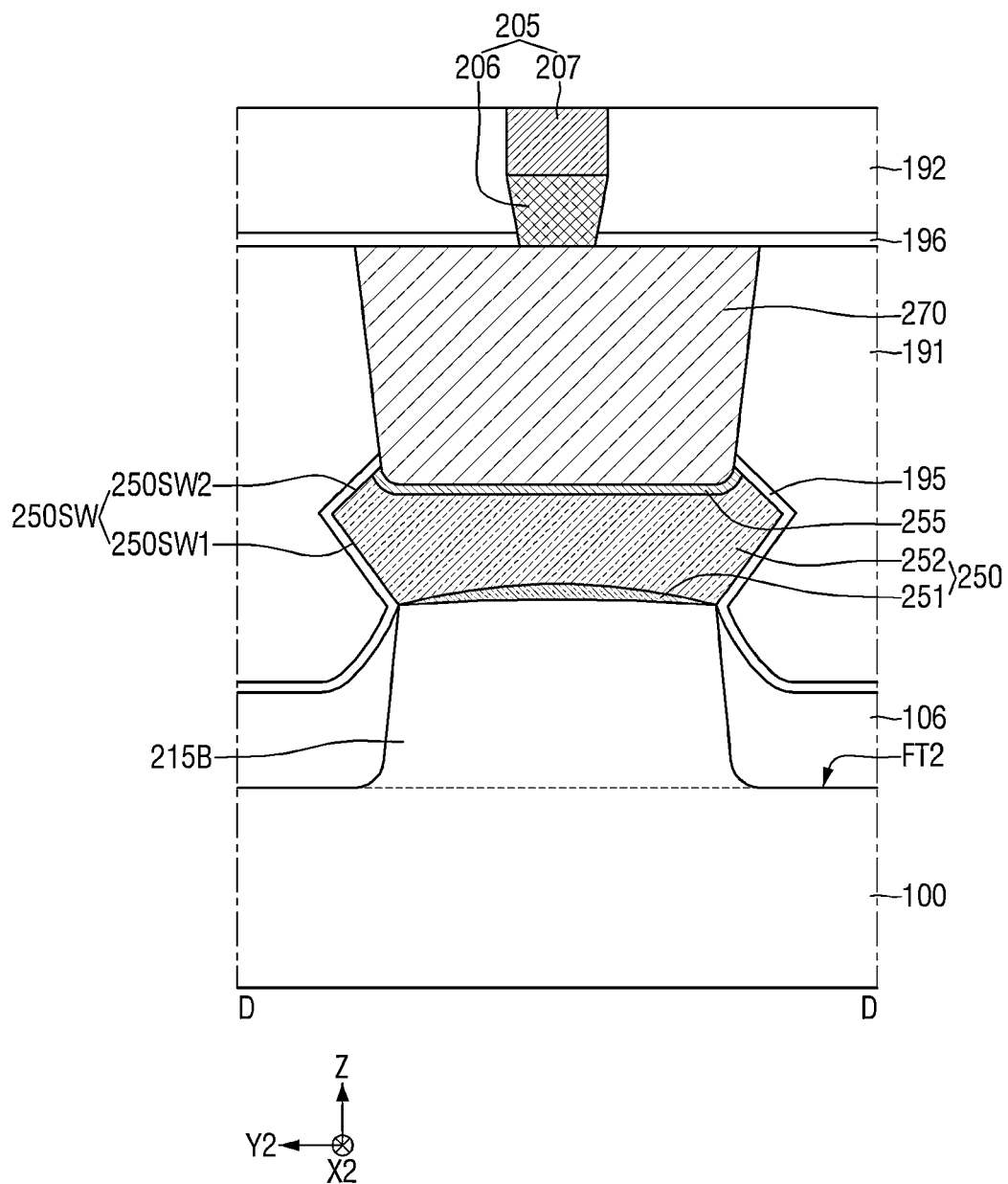
FIGS. 23 to 25 are cross-sectional views taken along line D-D, line E-E, and line F-F of FIG. 22, respectively.
Figure 24:
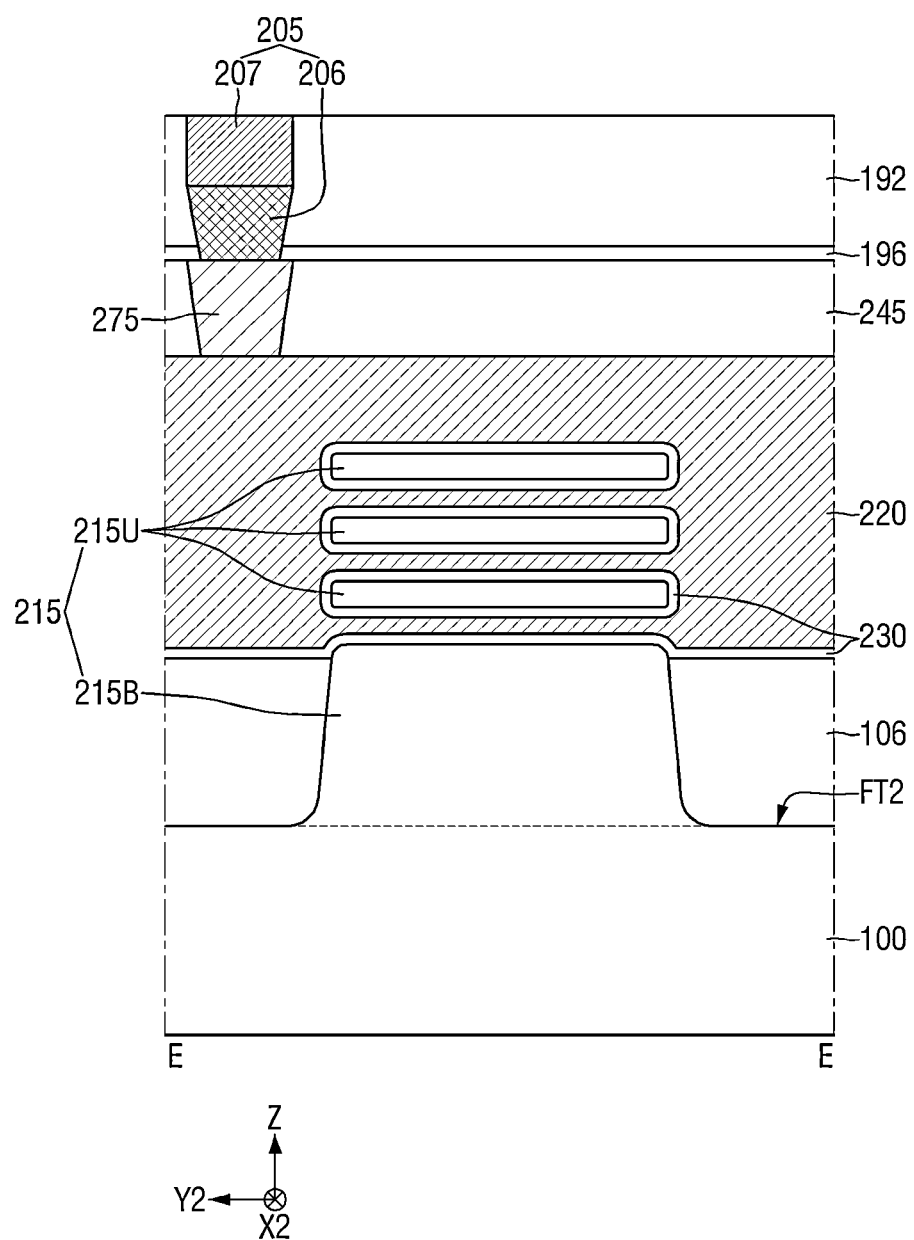
Figure 25:
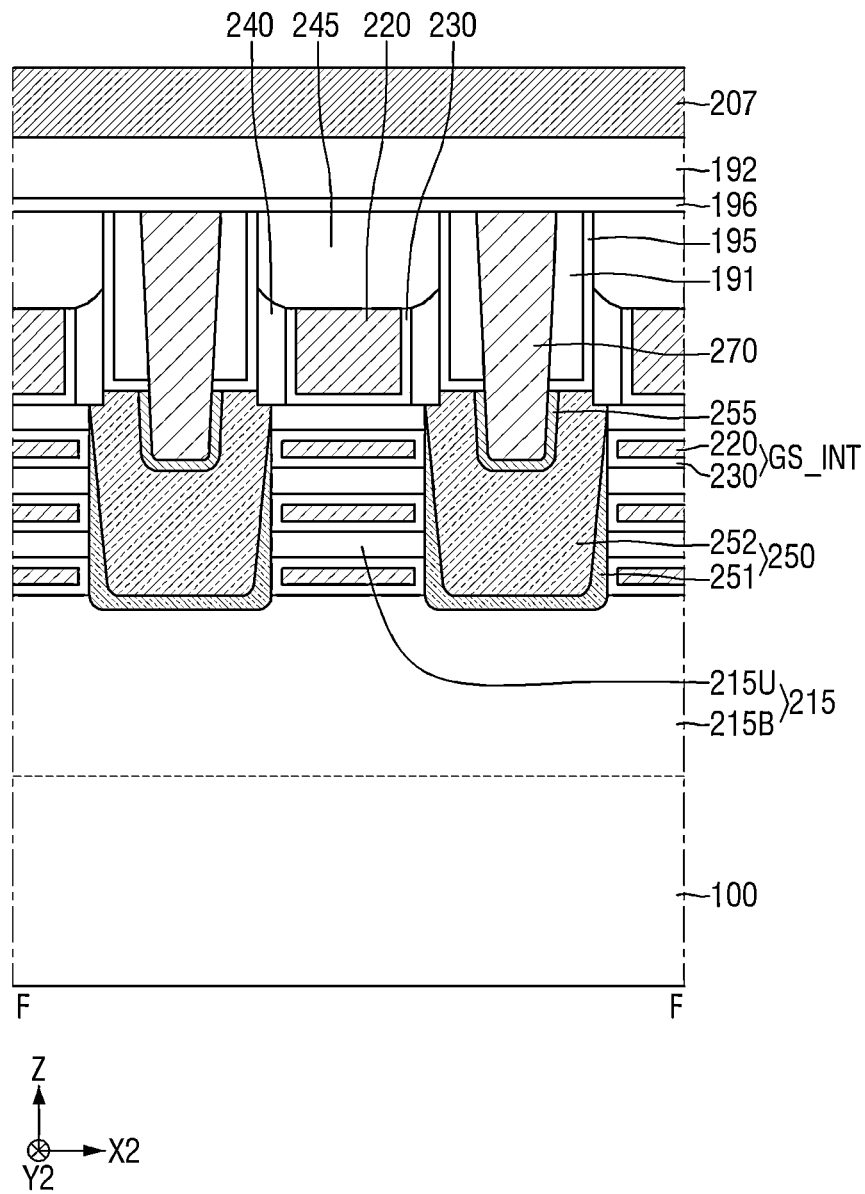

FIG. 22 is an illustrative layout diagram for describing a semiconductor device according to an example embodiment. FIGS. 23, 24, and 25 are cross-sectional views taken along line D-D, line E-E, and line F-F of FIG. 22, respectively.

A description for a first region I of FIG. 22 is the same as or substantially similar to that described with reference to FIGS. 1 to 19, and thus contents related to a second region II of FIG. 22 will be hereinafter described mainly.

Referring to FIGS. 22 to 25, a semiconductor device according to an example embodiment may include an active pattern 215, second gate electrodes 220, second source/drain patterns 250, and second source/drain contacts 270.

The active pattern 215 may be disposed on the substrate 100. The active pattern 215 may extend to be elongated in the third direction X2. The active pattern 215 may include a lower pattern 215B and a plurality of sheet patterns 215U.

The lower pattern 215B may protrude from the substrate 100. The lower pattern 215B may extend to be elongated in the third direction X2. The lower pattern 215B may be defined by the second fin trenches FT2.

The plurality of sheet patterns 215U may be disposed on an upper surface of the lower pattern 215B. The plurality of sheet patterns 215U may be spaced apart from the lower pattern 215B in the fifth direction Z. The respective sheet patterns 215U may be spaced apart from each other in the fifth direction Z. It has been illustrated in the drawings that three sheet patterns 215U are disposed in the fifth direction Z, but this is only for convenience of explanation, and the present disclosure is not limited thereto.

The lower pattern 215B may be formed by etching a portion of the substrate 100 or may include an epitaxial layer grown from the substrate 100. The lower pattern 215B may include silicon or germanium, which is an element semiconductor material. Further, the lower pattern 215B may include a compound semiconductor, for example, a group IV-IV compound semiconductor or a group III-V compound semiconductor. Each of the sheet patterns 215U may include one of silicon or germanium, which is an element semiconductor material, a group IV-IV compound semiconductor, or a group III-V compound semiconductor.

Widths of the sheet patterns 215U in the fourth direction Y2 may increase or decrease in proportion to a width of the lower pattern 215B in the fourth direction Y2. It has been illustrated as an example in the drawings that the widths, in the fourth direction Y2, of the sheet patterns 215U stacked in the fifth direction Z are the same as each other, this is only for convenience of explanation, and the present disclosure is not limited thereto. In some example embodiments, as the sheet patterns 215U become distant from the lower pattern 215B, the widths, in the fourth direction Y2, of the sheet patterns 215U stacked in the fifth direction Z may decrease.

The second field insulating film 106 may cover sidewalls of the lower pattern 215B. The second field insulating film 106 is not disposed on an upper surface of the lower pattern 215B. Each of the sheet patterns 215U is disposed on a level higher than an upper surface of the second field insulating film 106.

The second gate electrode 220 may be disposed on the lower pattern 215B. The second gate electrode 220 may cross the lower pattern 215B. The second gate electrode 220 may surround the sheet patterns 215U.

Second gate insulating films 230 may extend along the upper surface of the second field insulating film 106 and the upper surface of the lower pattern 215B. The second gate insulating films 230 may cover the sheet patterns 215U. The second gate insulating films 230 may be disposed along circumferences of the sheet patterns 215U.

An inter-gate structure GS_INT may be disposed between the sheet patterns 215U and between the lower pattern 215B and the sheet pattern 215U. The inter-gate structure GS_INT may include the second gate electrode 220 and the second gate insulating film 230 disposed between adjacent sheet patterns 215U and between the lower pattern 215B and the sheet pattern 215U.

Second gate spacers 240 may be disposed on sidewalls of the second gate electrode 220. The second gate spacers 240 may extend in the fourth direction Y2.

The second gate capping pattern 245 may be disposed on an upper surface of the second gate electrode 220 and upper surfaces of the second gate spacers 240.

A material included in the second gate insulating film 230 is the same as or substantially similar to that mentioned in the description for the first gate insulating film 130. A material included in the second gate spacer 240 is the same as or substantially similar to that mentioned in the description for the first gate spacer 140. A material included in the second gate capping pattern 245 is the same as or substantially similar to that mentioned in the description for the first gate capping pattern 145.

In concluding the detailed description, those skilled in the art will appreciate that many variations and modifications may be made to the disclosed example embodiments without substantially departing from the principles of the present inventive concepts. Therefore, the disclosed example embodiments of the inventive concepts are used in a generic and descriptive sense only and not for purposes of limitation.

What is claimed is:

1. A semiconductor device comprising:
   a plurality of first fin-shaped patterns in a first region of a substrate and spaced apart from each other in a first direction;
   a plurality of second fin-shaped patterns in a second region of the substrate and spaced apart from each other in a second direction;
   a first field insulating film on the substrate and covering sidewalls of the first fin-shaped patterns;
   a second field insulating film on the substrate and covering sidewalls of the second fin-shaped patterns;
   a first source/drain pattern on the first field insulating film, connected to the first fin-shaped patterns, and including a first silicon-germanium pattern; and
   a second source/drain pattern on the second field insulating film, connected to the second fin-shaped patterns, and including a second silicon-germanium pattern, the second source/drain pattern and the second field insulating film defining one or more first air gaps therebetween;
   wherein the first source/drain pattern includes first bottom surfaces connected to respective ones of the first fin-shaped patterns and one or more first connection surfaces each connecting a corresponding adjacent pair of the first bottom surfaces with each other,
   the second source/drain pattern includes second bottom surfaces connected to respective ones of the second fin-shaped patterns and one or more second connection surfaces each connecting a corresponding adjacent pair of the second bottom surfaces to each other,
   a number of first air gaps is same as a number of second connection surfaces, and
   at least one of the first connection surfaces is in entire contact with an upper surface of the first field insulating film.

2. The semiconductor device of claim 1, wherein the first connection surfaces are in entire contact with the upper surface of the first field insulating film.

3. The semiconductor device of claim 1, wherein
   the first source/drain pattern and the first field insulating film define one or more second air gaps therebetween, and
   a number of second air gaps is less than a number of first connection surfaces.

4. The semiconductor device of claim 3, wherein a size of the first air gap is greater than a size of the second air gap.

5. The semiconductor device of claim 1, wherein a number of first fin-shaped patterns is more than a number of second fin-shaped patterns.

6. The semiconductor device of claim 5, wherein the number of first fin-shaped patterns is four or more.

7. The semiconductor device of claim 1, wherein
   the first source/drain pattern includes connection semiconductor regions extending along the upper surface of the first field insulating film, and
   the connection semiconductor regions include silicon-germanium.

8. The semiconductor device of claim 1, wherein
   the first field insulating film includes first, second, and third regions, the first, second, and third regions each being between an adjacent pair of the first fin-shaped patterns,
   the second region of the first field insulating film is between the first region of the first field insulating film and the third region of the first field insulating film, and
   a height of an upper surface of the second region of the first field insulating film is different from a height of an upper surface of the third region of the first field insulating film.

9. The semiconductor device of claim 8, wherein a height of an upper surface of the first region of the first field insulating film is same as the height of the upper surface of the second region of the first field insulating film.

10. The semiconductor device of claim 8, wherein the height of the upper surface of the second region of the first field insulating film is greater than a height of an upper surface of the first region of the first field insulating film, and is smaller than the height of the upper surface of the third region of the first field insulating film.

11. The semiconductor device of claim 8, wherein a height of an upper surface of the first region of the first field insulating film and the height of the upper surface of the third region of the first field insulating film are smaller than the height of the upper surface of the second region of the first field insulating film.

12. The semiconductor device of claim 8, wherein a height of an upper surface of the first region of the first field insulating film and the height of the upper surface of the third region of the first field insulating film are greater than the height of the upper surface of the second region of the first field insulating film.

* * * * *